US006812396B2

(12) United States Patent
Makita et al.

(10) Patent No.: US 6,812,396 B2
(45) Date of Patent: Nov. 2, 2004

(54) PHOTOVOLTAIC POWER GENERATION SYSTEM

(75) Inventors: Hidehisa Makita, Kyoto (JP); Akiharu Takabayashi, Nara (JP); Toshihiko Mimura, Nara (JP); Masaaki Matsushita, Nara (JP); Takaaki Mukai, Nara (JP); Shigenori Itoyama, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 102 days.

(21) Appl. No.: 10/229,080

(22) Filed: Aug. 28, 2002

(65) Prior Publication Data
US 2003/0075211 A1 Apr. 24, 2003

(30) Foreign Application Priority Data

Aug. 30, 2001 (JP) ........................................ 2001-261109
Aug. 23, 2002 (JP) ........................................ 2002-243154

(51) Int. Cl.[7] ........................ H01L 31/042; H01L 31/05; H02H 7/20
(52) U.S. Cl. ........................ 136/244; 136/291; 136/293; 323/906; 363/56.03; 361/49; 361/42
(58) Field of Search ................................. 136/244, 293, 136/291; 323/906; 363/56.03; 361/49, 42

(56) References Cited

U.S. PATENT DOCUMENTS

| 5,712,572 | A | * | 1/1998 | Tamechika et al. ......... 324/551 |
| 6,107,560 | A | * | 8/2000 | Takehara et al. ............ 136/248 |
| 6,320,769 | B2 | * | 11/2001 | Kurokami et al. ........ 363/56.03 |
| 6,593,520 | B2 | * | 7/2003 | Kondo et al. ................ 136/244 |
| 2001/0048605 | A1 | * | 12/2001 | Kurokami et al. ........ 363/56.03 |
| 2002/0105765 | A1 | * | 8/2002 | Kondo et al. .................. 361/42 |
| 2002/0195136 | A1 | * | 12/2002 | Takabayashi ............... 136/244 |
| 2002/0195138 | A1 | * | 12/2002 | Itoyama et al. ............. 136/251 |
| 2003/0067723 | A1 | * | 4/2003 | Suzui et al. ................... 361/42 |
| 2003/0111103 | A1 | * | 6/2003 | Bower et al. ................ 136/244 |

FOREIGN PATENT DOCUMENTS

JP 2002-207662 7/2000

\* cited by examiner

Primary Examiner—Alan Diamond
(74) Attorney, Agent, or Firm—Fitzpatrick, Cella, Harper & Scinto

(57) ABSTRACT

A solar cell array having an exposed electroactive portion is connected to a system power supply through an insulation transformer, a ground-fault interrupter is provided between the solar cell array and the system power supply, and a ground-fault detector is provided at the grounded line of the solar cell array. A set current value at which the ground-fault detector judges a ground-fault is larger than an amount of a set current value at which the ground-fault interrupter interrupts a circuit. The insulation transformer is provided between the solar cell array and the system power supply. Owing to such structure, the present invention aims at the simplification of environment-resistive coating having a large ratio of cost of the solar cell, and the simplification of insulating coating of members that connect the solar cells in series and parallel, and provides a photovoltaic power generation system which does not stop by the leakage current of the electroactive portion in connection with such simplification of the environment-resistive coating and insulating coating.

10 Claims, 13 Drawing Sheets

PHOTOVOLTAIC POWER GENERATION SYSTEM

BACKGROUND OF THE INVENTION

1. Field of the Invention

The present invention relates to a photovoltaic power generation system that has an exposed electroactive portion.

2. Related Background Art

In recent years, awareness of ecological problems has been raised worldwide. Among others, the global warming resulting from $CO_2$ emission is a serious concern, and clean energy has been desired increasingly. In such a circumstance, a solar battery shows great promise to serve as a source of clean energy in terms of its safety and operability.

The solar battery includes a photoelectric conversion layer for converting light into electricity, typical materials of which include single-crystal silicon semiconductor, polycrystalline silicon semiconductor, amorphous silicon-based semiconductor, groups III–V compound semiconductor, groups II–VI compound semiconductor and groups I–II-I–VI2 compound semiconductor.

An example of a typical solar cell module is shown in FIGS. 6A and 6B. In these figures, FIG. 6A is an outside view of a solar cell module 601, and FIG. 6B is a sectional view taken in the line 6B—6B of FIG. 6A. As shown in FIG. 6B, the solar cell module 601 consists of a photovoltaic element 602 that converts received light into electricity, a solar cell envelope, and an output cable 605 for taking out an output, in rough classification. Then, the solar cell envelope comprises a front cover 603 that is made of a glass plate, a light-transmissive resin, or the like and is arranged in the side of a light-receiving surface of a photovoltaic element, a back cover 604 that is made of a glass plate, a resin, a metal plate, or the like and is arranged in the side of a non-light-receiving surface, a frame member 607 to reinforce and fix the solar cell module, and an adhesive 606 to bond the frame member.

In addition, so as to mutually connect solar cell modules in series or parallel, a cable such as an IV wire, a CV cable, or the like that is coated with insulating coating is used.

Then, since a solar cell array that uses these members is strictly given insulation measures to the solar cell modules and wiring members, a DC output generated by the solar cell array hardly flows to the ground as a leakage current Ir even in a moist state like fair weather after rainfall. Therefore, a leakage current from the solar cell array is smaller than a set current of a ground-fault interrupter (earth leakage breaker) in a receiving terminal.

A photovoltaic power generation system utilizing such a solar cell exists in a wide variety of scales from several watts to several thousands kilowatts. For example, a photovoltaic power generation system using a battery to store energy generated by the solar cell, or a photovoltaic power generation system using a DC-AC converter to supply output energy of the solar cell to a commercial electric power system (simply referred to as "system (power system)" hereinafter).

FIG. 2 is a block diagram of a typical photovoltaic power generation system disclosed in Japanese Patent Application Laid-Open No. 2000-207662. In this photovoltaic power generation system, four solar cell strings 204 to 207 are connected in parallel to constitute a solar cell array 201, each of the solar cell strings being composed of a plurality of solar cell modules connected in series. An output of the solar cell array 201 is led to a power conditioner 202 having a controller for controlling a maximum output, for example, and then supplied to a load 203. The load 203 may be a system, and such a system of flowing the power of the solar cell back to the system is referred to as "system-interconnecting system (utility connected system)".

The typical structure of these system-interconnecting systems will be explained below.

FIG. 4 shows a schematic diagram of a solar cell array that uses a power conditioner without an insulating transformer. Here, reference numeral 401 denotes a solar cell array, 402 does an inverter, 403 does a differential current sensor, 404 does a switchboard, 405 does a system (power system), 406 does a load, 407 does a current I1 that flows from a positive electrode terminal of the solar cell array, 408 does a current I2 that flows into a negative electrode terminal of the solar cell array, and 409 does a ground-fault interrupter.

A DC—DC converter boosts an output from the solar cell array 401, and the inverter 402 converts it into an alternating current at the commercial frequency. In the case of a single-phase three-wire system, electric power is supplied to a 200-V circuit in a single phase, and only a system-interconnecting apparatus detects three lines in a single phase. Since being small, light, and low-cost, and also reliable, this system becomes a main stream in the present power conditioners. Nevertheless, it is known that there is a demerit that, since this system is not isolated from the power conditioner, it is necessary to ground a conductive part of an envelope of a solar battery in preparation for the case where a flaw etc. arises in the envelope of the solar battery, and hence, the construction of the solar cell array becomes complicated.

In this solar cell array without an insulating transformer, it is possible to detect a ground-fault from the solar cell array 401 by the following system.

That is, when the ground-fault arises in the solar cell array 401, a ground-fault current flows in a circuit of (solar cell array)→(ground)→(system (power system))→(power conditioner)→(solar cell array), and hence, the relation between the current 407 and current 408 that are shown in FIG. 4 becomes off balance. The ground-fault can be detected by detecting a differential current between them.

When being connected to the system, these system-interconnecting systems are connected via each receiving terminal. In addition, other loads used are connected in these receiving terminals. FIG. 5 shows the relation between the ground-fault interrupter 409 and load 406 that are installed in the receiving terminal.

The ground-fault interrupter comprises a zero-phase-sequence current transformer 501, a sensitivity-switching device 502, an amplifier 503, a coil 504, an opening and closing mechanism 505, a test button 506, and a leak display panel 507. Reference numeral 508 denotes a system (power system), 509 denotes a load, 510 denotes a power conditioner, and 511 denotes a solar cell array.

The zero-phase-sequence current transformer 501 detects a differential current between an outgoing current from the system side and a returning current from the load. When the leak arises, that is, the differential current is a set current or more, a circuit breaker interrupts a line. In general, in such a ground-fault interrupter, it is possible to set a sensitivity current and detection time with respect to leak.

Then, it is usual that the power conditioner 510 is connected to this load 509 in parallel.

Therefore, as for a set current value of the ground-fault detector incorporated in the power conditioner 510 of the solar cell array using the conventional solar cell module, which is strictly insulated and the wiring members, and a set current value of the ground-fault interrupter installed in the receiving terminal, the set current value of the ground-fault interrupter is set larger than the set current value of the ground-fault detector. This is because it becomes almost meaningless to provide the ground-fault detector since the ground-fault interrupter unintentionally operates before the ground-fault detector operates if the set current value of the ground-fault interrupter is smaller than the set current value of the ground-fault detector.

On one side, in the power conditioners with each insulating transformer, there are two types depending on the type of a transformer.

One type of power conditioner uses a commercial-frequency transformer, and is a system to perform the insulation and voltage conversion with the commercial-frequency transformer after converting a DC output from the solar cell array into a commercial-frequency AC voltage. This system is excellent in thunder resistance and noise cutting property, and can supply electric power to a single-phase three-wire system of distribution line with keeping balance. Nevertheless, since using the commercial-frequency transformer, this system is heavy and expensive.

Another type of power conditioner uses a high-frequency transformer, and is insulated with the small high-frequency transformer after converting a DC output from the solar cell array into a high-frequency AC voltage. After that, the power conditioner converts the high-frequency AC voltage into a DC voltage once, and converts the DC voltage into the commercial-frequency AC voltage again. Since using the high-frequency transformer, this system is small, but has a demerit of being expensive because of complicated circuit structure.

In these insulation transformer systems of photovoltaic power generation systems, since a solar battery and the ground are basically insulated from each other, it is impossible to detect a ground-fault by a method similar to the system without an insulation transformer. Then, in the insulation transformer system of the photovoltaic power generation system, a ground-fault from the solar cell array is detected by the system shown in FIG. 3. Here, reference numeral 301 denotes a solar cell array, 302 does a resistor, 303 does a DC voltage detector, 304 does an insulation transformer, 305 does an inverter, 306 does a switchboard, 307 does a ground-fault interrupter, 308 does a grounding conductor, 309 does a system (power system), and 310 does a load.

Two high-resistance resistors 302 that have the same resistance are connected is series between input terminals of the solar cell array 301, and a node (voltage-dividing point) of both resistors is connected to a terminal of the DC voltage detector 303. The other terminal of the DC voltage detector 303 is connected to the ground through a ground terminal.

Hereafter, a mechanism of ground-fault detection will be explained. Since the DC voltage detector 303 is also a high-resistance body, the solar cell array is electrically connected to the ground through the high-resistance resistor 302 and DC voltage detector 303. When a DC ground-fault does not arise, any current does not flow at both terminals of the DC voltage detector 303, and hence, a voltage to the ground is 0 V. Nevertheless, when the ground-fault to the ground voltage arises, the voltage is generated at both terminals of the DC voltage detector through the leakage current to the ground. Hence, it is possible to measure the presence of the ground-fault by using this.

One of the largest problems of the photovoltaic power generation system is reduction of the power generation cost. Particularly, in order to introduce the photovoltaic power generation system into the electricity market on a full scale, the cost reduction is essential, and it is needed to attain a cost comparing with the cost of conventional thermal power generation or nuclear power generation. However, as reported in an interim report (Jun. 11, 1998) from the Supply and Demand Party of the Advisory Committee for Resources and Energy of the Ministry of Economy, Trade and Industry, the energy cost of the photovoltaic power generation is 2.5 to 6 times the electricity rate in Japan, and a radical cost reduction is needed for full-scale introduction thereof.

In view of such circumstances, the inverters attempted to simplify an environmental resistant coating significantly responsible for a cost of a solar cell module and a disposing member for interconnecting solar cells in series or parallel.

Generally, a cost rate of members of the solar cell module except a solar cell such as a coating member, a frame member, a solar cell envelope such as a junction box and cables, and connectors to the whole solar cell module is near to 50%, which is large. Therefore, if the cost of these members can be reduced, it is possible to expect the remarkable cost reduction of the solar cell module. In addition, by not using the insulating coating material of the cable that connects the solar cell module mutually, it becomes possible not only to reduce material cost, but also to omit the time for peeling the coating material. Hence, there is an advantage that it is possible to reduce the cost of construction such as connection and soldering when constructing the solar cell module.

Then, the present inventors have invented the use of the following solar cell.

That is, though use under an environment from which ordinary people could not go easily in and out was predicated, photovoltaic elements were protected to environmental stress as a requirement specification of the solar cell module, but electric insulation performance was removed from the requirement specification, and a specification that an electroactive portion was partially exposed was examined. As a result, the present inventors found that it was possible to remarkably thin the front cover and the back cover, and hence, it was possible to expect remarkable cost reduction. In addition, the present inventors found that, also as for the connection member that connected the solar cells in series and parallel, similarly, it became possible to expect remarkable cost reduction by removing the insulation performance from the requirement specification.

As shown in FIGS. 6A and 6B, a conventional solar cell module required a lot of materials for an envelope consisting of the front cover 603, the back cover 604, the frame member 607, etc. besides the photovoltaic element 602 that is a component at least necessary for electric power generation. These materials are necessary for protecting the solar cell module from an outdoor environment that receives heat stress, optical stress, and mechanical stress, and for securing electric nonconductivity. Nevertheless, it can be said that these are excessive protection materials when being installed under an environment such as a power generation station which ordinary people cannot go easily in and out, and is strictly controlled with predicating regular maintenance.

Nevertheless, the use of a form of the simplification of environment-resistive coating of the solar cell and/or the use of bare members, which connect solar cells in series and parallel, without the insulating coating caused a problem that a conventional solar cell array had not.

That is, since at least a part of an electroactive portion of the electrode and wiring member of the solar cell, and the series-parallel connection members of the array is bare and is not isolated, a current route is formed in a route of (electroactive portion of solar cell array) to (rain water) to (moist concrete) to (rain water) to (ground) or (electroactive portion of solar cell array)→(rain water)→(ground) when the environment became in a moist state (state that the resistance between the electroactive portion of the solar cell array and the ground decreases by moisture) with rain water etc. As a result, leaks frequently arise from the electroactive portion of the solar cell array to the ground to generate leakage currents unintentionally.

In addition, it was also found that, when an electroactive portion of a solar cell was bare, a leakage current flowing into the ground in a moist state usually exceeded a set current value of the ground-fault interrupter installed in the receiving terminal. (Ir>Set current of ground-fault interrupter)

In a power conditioner connected to a solar cell array, if a ground-fault detector operates each time by a leakage current caused in such a moist state, and the system and the array are made to drop out, the power conditioner cannot be used naturally. Then, it is necessary to set the set current value of the ground-fault detector larger than the leakage current in the moist state. This is because it needs much time to maintain the power conditioner whenever a malfunction arises since it is necessary to restore the ground-fault interrupter of the photovoltaic power generation apparatus by a switch in the power conditioner interrupted by the ground-fault detection.

Though it is conceivable to set the set current value of the ground-fault detector not larger than the leakage current and to automatically return the ground-fault interrupter alternatively, the ground-fault detector originally prevents the ground-fault beforehand usually. Hence, since it is dangerous to automatically return this unconditionally, it must not be performed. That is, when the power conditioner is stopped by the ground-fault detector, it is necessary to specify where the ground-fault arises in the solar cell array and to restore the power conditioner after proper treatment is performed. Therefore, this is because an existence value of the ground-fault detector is lost if the power conditioner is automatically returned unconditionally.

However, if the leakage current value in the moist state is larger than the set current value of the ground-fault interrupter like the solar cell whose electroactive portion is bare, the leakage current flows into the receiving terminal with passing through the power conditioner even if the set current value of the ground-fault detector is set larger than the leakage current value. Hence, at this time, the ground-fault interrupter that is installed in the receiving terminal operates unintentionally. As a result, similarly much time is consumed.

In addition, a more serious problem is caused in this case. This is because power supply to all loads, which are connected to the receiving terminal, as well as the photovoltaic power generation system, is interrupted when the ground-fault interrupter that exists in the receiving terminal operates as the result of the occurrence of a leakage current in the solar cell array.

It is not possible to set the set current value of the ground-fault interrupter larger than the above-mentioned leakage current similarly to the ground-fault detector. This is because the set current value is not determined only by the solar cell array since the ground-fault interrupter is different from the ground-fault detector. That is, since the set current value is determined also by demands from other loads, it is dangerous to greatly change this value fruitlessly, and it is also prohibited by the Electrical Installation Standards.

SUMMARY OF THE INVENTION

Then, a major object of the present invention is to solve the above-mentioned problems in a photovoltaic power generation system having a solar cell array that has an exposed electroactive portion, separately or in a lump.

The present inventors found that it was suitable to use the following means so as to correspond to the above-mentioned problems. Hereafter, specific means and actions will be explained.

The present invention provides a photovoltaic power generation system comprising: a solar cell array having a plurality of solar cells electrically connected to each other with a wiring member, a power conditioner for converting an output from the solar cell array into AC power, an insulation transformer provided between the solar cell array and a system power supply, a ground-fault interrupter provided between the power conditioner and the system power supply, and a ground-fault detector for detecting ground-fault of the solar cell array, wherein a part of at least any one of an electroactive portion of the above-mentioned plurality of solar cell elements and an electroactive portion of the above-mentioned wiring member is exposed to the outside, wherein a line (electric path) of the above-mentioned solar cell array is grounded, wherein a ground-fault detector is provided at the ground line, and wherein a set current value at which the above-mentioned ground-fault detector judges a ground-fault is larger than a set current value at which the above-mentioned ground-fault interrupter interrupts the line.

When a leakage current Ir [A] flows in a current route from the above-mentioned electroactive portion to the ground, which is formed while the above-mentioned solar cell array operates in a moist state, it is preferable in the photovoltaic power generation system of the present invention that the set current value of the above-mentioned ground detector is larger than Ir, and the set current value of the above-mentioned ground-fault interrupter is smaller than Ir.

In addition, in the photovoltaic power generation system of the present invention, it is preferable that the above-mentioned ground-fault detector operates by using a current flowing in the above-mentioned grounding line as a power supply; that a positive electrode terminal or a negative electrode terminal of the solar cell array is grounded; that a line is ground so that a ratio of an absolute value of a voltage between the positive electrode terminal of the solar cell array and the ground to an absolute value of a voltage between the negative electrode terminal of the solar cell array and the ground may become approximately 2:1; that a part of at least one of an electrode, arranged on the side of a light-receiving surface of the above-mentioned solar cell, and the above-mentioned wiring member is not put in a solar cell envelope; that each of the above-mentioned solar cells comprises a photoelectric conversion layer, a collecting electrode arranged on a side of a light-receiving surface of the photoelectric conversion layer, a surface wiring member and a coating member, and has an exposed portion, which is not coated with the coating member, in a part of the collecting electrode or the surface wiring member; that the above-mentioned coating member is composed of a resin and formed by coating; and that the series-parallel connection member for connecting the above-mentioned solar cells in series and/or parallel is a conductor that is not coated with an insulating material.

In addition, the photovoltaic power generation system of the present invention is characterized in that the above-mentioned solar cell array is installed on a supporting member, and it is preferable in this photovoltaic power generation system that the above-mentioned supporting member is a concrete stand.

As previously stated, in the case of the photovoltaic power generation system connected to a system-interconnecting power conditioner circuit without an insulation transformer, as shown in FIG. 4, since the solar cell array 401 is connected to the grounding line of the system (power system) 405 through an SW element of the system (power system) 405 and the power conditioner, the output of the solar cell array 401 is coupled to the ground while the power conditioner operates. Hence, some voltage is applied between the electroactive portion of the solar cell array 401 and the ground.

In addition, also in the case of the solar cell array connected to the system-interconnecting power conditioner circuit with an insulation transformer, as shown in FIG. 3, the solar cell array is connected to the ground through some extent of a resistance via the ground-fault detector 303. Furthermore, in the United States, as described in IEEE standards 1374-1998: "Guide for Terrestrial Photovoltaic Power System Safety" or National Electrical Code Article 690: "Solar Photovoltaic Systems", since it is obligated that the line of the solar cell array is grounded somewhere of the line of the array, some extent of voltage is always applied between the electroactive portion of the solar cell array and the grounds.

Therefore, in the solar cell array that has the electroactive portion exposed in a solar cell and/or a wiring member that electrically connects the solar cell, a leakage current route is formed between the ground and the electroactive portion of the solar cell array in a moist state during rainfall or after the rainfall, and a leakage current is generated.

As previously stated, a photovoltaic power generation system using a solar cell array having an electroactive portion in the solar cell and/or the wiring member that is electrically connected to the solar cell frequently malfunctions at a set current value not larger than that of a receiving ground-fault interrupter that is a set current value of a usual ground-fault detector by a leakage current due to a drop of insulation resistance of the solar cell array that is caused by the moist state at the rainfall. Then, it is necessary to set a set current value so that the ground-fault detector should not be dropped at a leakage current that arises in the solar cell array in the moist state.

In a photovoltaic power generation system of the present invention, the sensitivity of a ground-fault detector is dropped (a set current value is made large), and at the same time, so as to prevent a leakage current from flowing into the ground-fault interrupter in a receiving terminal to operate the ground-fault interrupter, an insulation transformer is provided between the solar cell array and the system (power system). Specifically, an apparatus using a high-frequency or a commercial-frequency insulation transformer is used as a power conditioner. As a result, as shown in FIG. 9, since a solar cell array 901 and a system (power system) 907 are insulated by an insulation transformer 902, the circuit of (solar cell array)→(ground)→(system (power system))→(solar cell array) is not connected, and hence, a leakage current never flows into the ground-fault interrupter 905 at the receiving terminal. In FIG. 9, reference numeral 903 denotes a power conditioner, 904 does a switchboard, an 906 does a load.

In this manner, according to the photovoltaic power generation system of the present invention, though the set current value of the ground-fault detector is made larger than the set current value of the ground-fault interrupter, it is possible to prevent the ground-fault interrupter from dropping even if a leakage current of the solar cell array exceeds the set current value of the ground-fault interrupter. Hence, it becomes possible to prevent a malfunction of the photovoltaic power generation system by the leakage current of the solar cell array.

In addition, in the photovoltaic power generation system of the present invention, it is preferable that the above-mentioned ground-fault detector operates by using a current, flowing in the above-mentioned grounded line as a power supply; and that each of the above-mentioned solar cells comprises a photoelectric conversion layer, a collecting electrode, arranged on the side of a light-receiving surface of the photoelectric conversion layer, a surface wiring member and coating material, and has an exposed portion, which is not coated with the coating member, in a part of the collecting electrode or the surface wiring member.

DETAILED DESCRIPTION OF THE PREFERRED EMBODIMENTS

Hereafter, embodiments of a photovoltaic power generation system of the present invention will be explained with referring to drawings if necessary. In addition, the present invention is not limited to the following description and drawings, but it is needless to say that it is possible to properly perform modification and combination within a range of purport of the present invention.

Figure 11A:
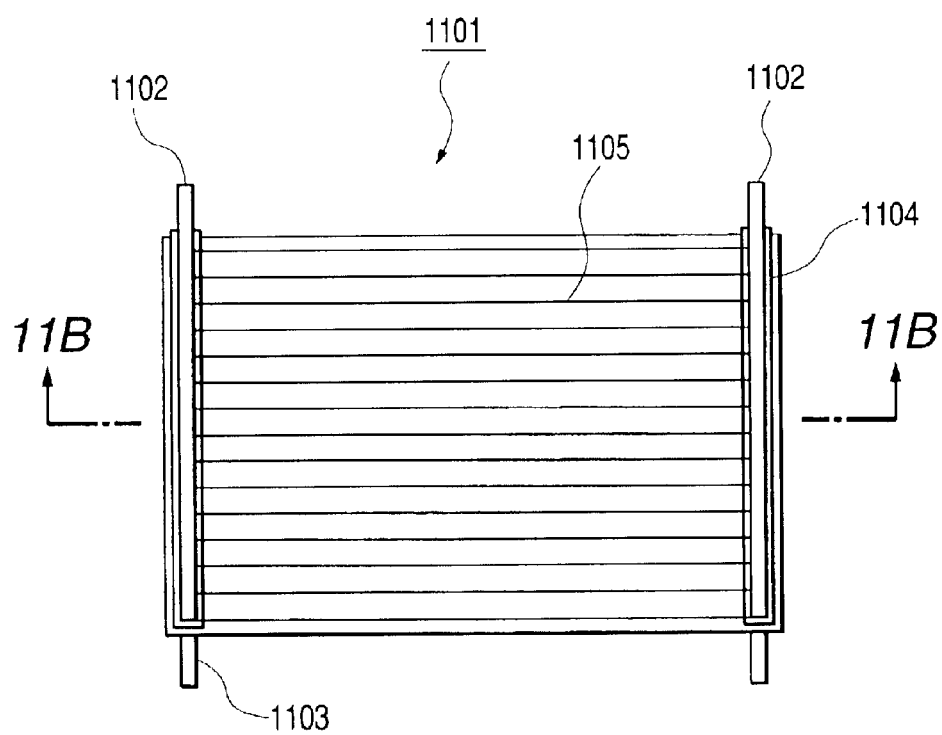
FIGS. 11A and 11B are a plan view and a sectional view showing one structural example of a solar cell suitably used in the present invention.
Figure 11B:
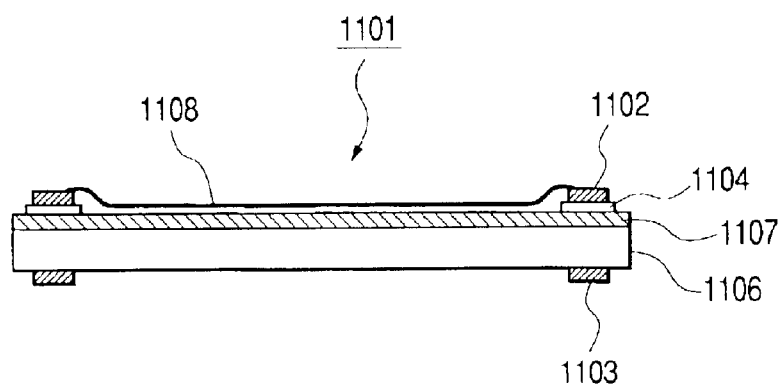

FIGS. 11A and 11B shows an example of a solar cell suitable for constituting a solar cell array installed in a photovoltaic power generation system of the present invention. In these figures, FIG. 11A is a top plan view of the solar cell, and FIG. 11B is a sectional view taken in the line 11B—11B of FIG. 11A.

A solar cell 1101 has a photovoltaic element layer 1107 formed on a metal substrate 1106 that is also a back electrode, and a collecting electrode 1105 for collecting currents generated in the photovoltaic element is arranged on the side of its light-receiving surface. Here, the solar cell 1101 is constituted by using a stainless steel plate of 0.15 mm thick (outside dimensions are 240 mm×360 mm) as the metal substrate 1106, using an amorphous silicon-based photovoltaic element as the photovoltaic element layer 1107, and using a copper wire of 100 $\mu$m$\phi$ as the collecting electrode 1105, which is fixed with a conductive paste on the photovoltaic element layer 1107.

In addition, the collecting electrode 1105 is connected to a surface wiring member 1102 that is made of copper and has the thickness of 100 $\mu$m, and this surface wiring member 1102 is used as an electrode on the side of the light-receiving surface of the solar cell and for series-parallel connection with adjoining solar cells. Furthermore, in order to surely insulate the surface wiring member 1102 and the metal substrate 1106, an insulating member 1104 made of polyester is arranged.

Moreover, on the side of a non-light-receiving surface of the metal substrate 1106, a 100-$\mu$m thick back wiring member 1103 made of copper is spot-welded, and this back wiring member 1103 is used as an electrode on the side of the non-light-receiving surface of the solar cell and for series-parallel connection with adjoining solar cells.

In addition, in order to protect the solar cell from an outdoor environment, the side of the light-receiving surface of the photovoltaic element layer 1107 is covered with 50-$\mu$m thick coating member 1108 made of acrylic resin material. However, for the improvement of workability, and for reduction of the coating material, the surface wiring member 1102, the side of the non-light-receiving surface of the metal substrate 1106, and the back wiring member 1103 are not coated with the coating member.

Figure 12A:
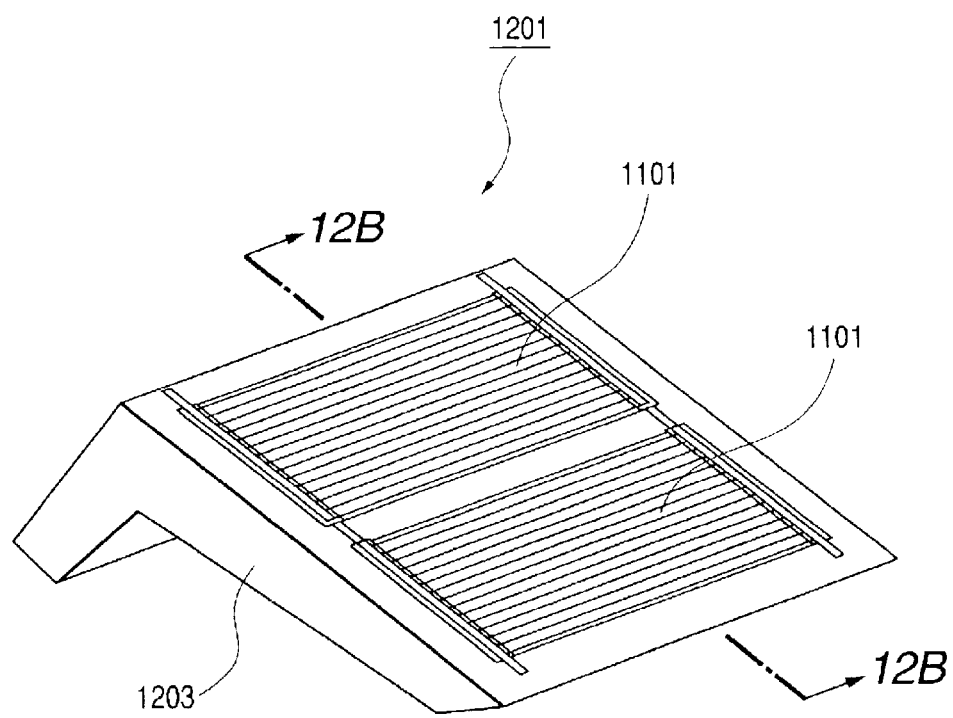
FIGS. 12A and 12B are a respective view and a sectional view showing a solar cell with a stand where the solar cells in FIGS. 11A and 11B are used.
Figure 12B:
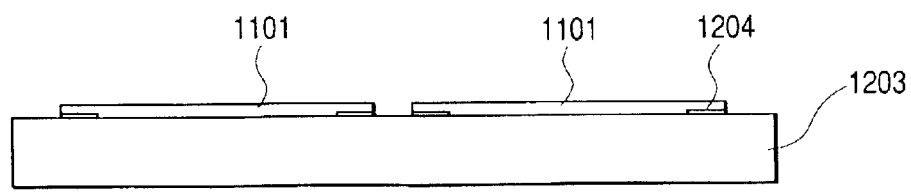

In addition, a suitable example of fixing the solar cell 1101 shown in FIGS. 11A and 11B to the supporting member (stand) is shown in FIGS. 12A and 12B. In these figures, FIG. 12A is a perspective view of a solar cell 1201 with a stand, and FIG. 12B is a sectional view taken in the line 12B—12B of FIG. 12A.

This example is a solar cell 1201 with a stand constituted by applying an elastic epoxy-based adhesive 1204 on the periphery of two solar cells 1101 that are serialized, and bonding them on an L-shaped concrete member 1203 as the supporting member (stand). The serialization of solar cells 1101 is performed by connecting the surface wiring member of a solar cell 1101 to the back wiring member of an adjacent solar cell. The solar cell 1201 with the stand that has such a structure is included in the solar cell array of the present invention.

In addition, as shown in FIG. 12B, since adhesive material 1204 for fixing the solar cell 1101 to the L-shaped concrete member 1203 is applied only to the periphery of the solar cell 1101, the back electrode of a central portion of the solar cell 1101 and a part of the back wiring member contact directly to the surface of the L-shaped concrete member 1203.

Figure 1:
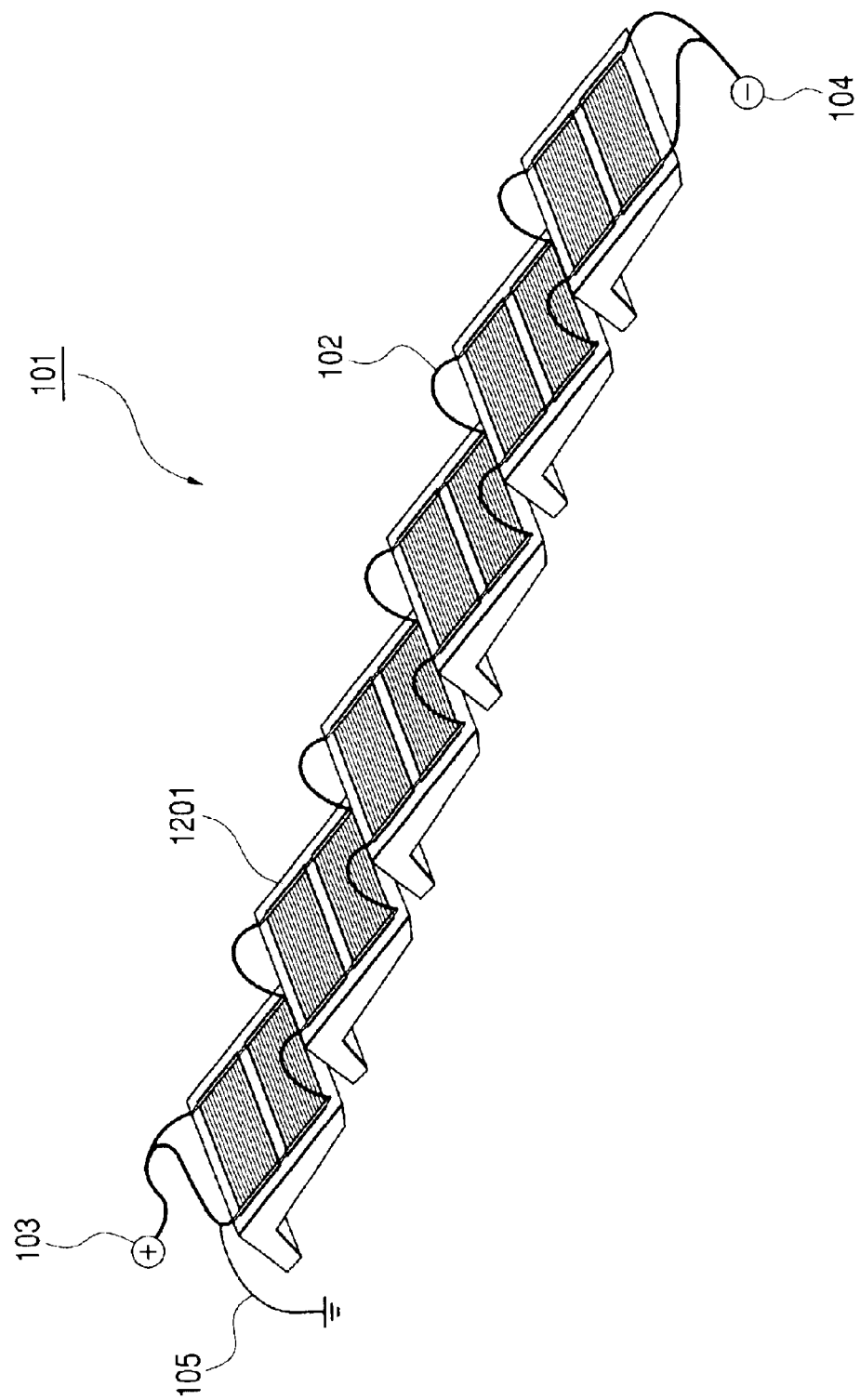
FIG. 1 is a perspective view showing one structural example of a solar cell string of the present invention.
Figure 2:
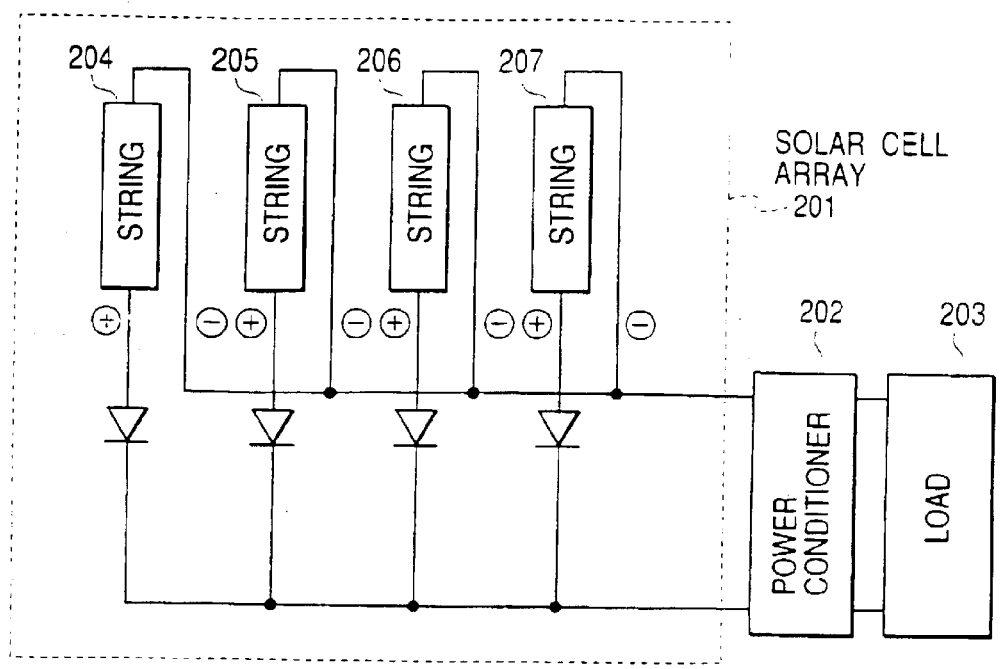
FIG. 2 is a block diagram of a typical photovoltaic power generation system.
Figure 3:
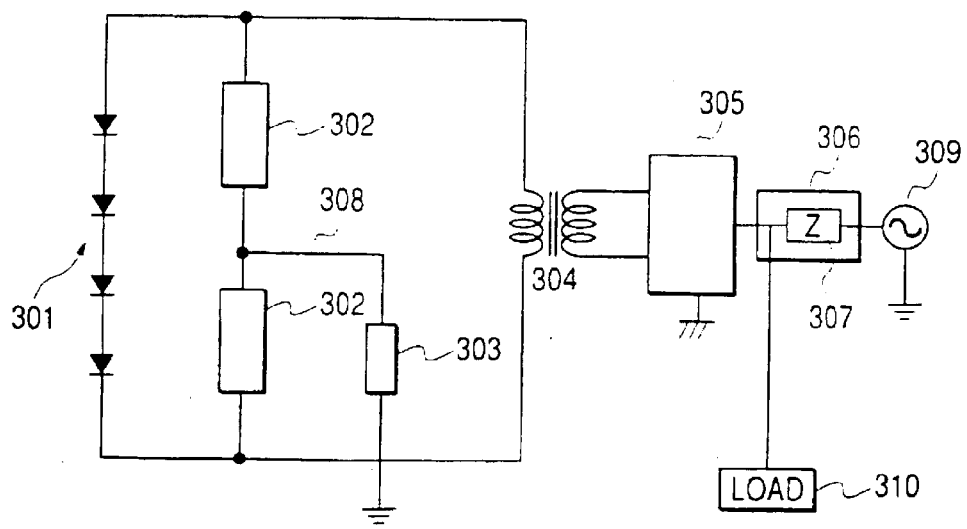
FIG. 3 is a circuit diagram of a photovoltaic power generation system that uses a power conditioner with an insulation transformer.
Figure 4:
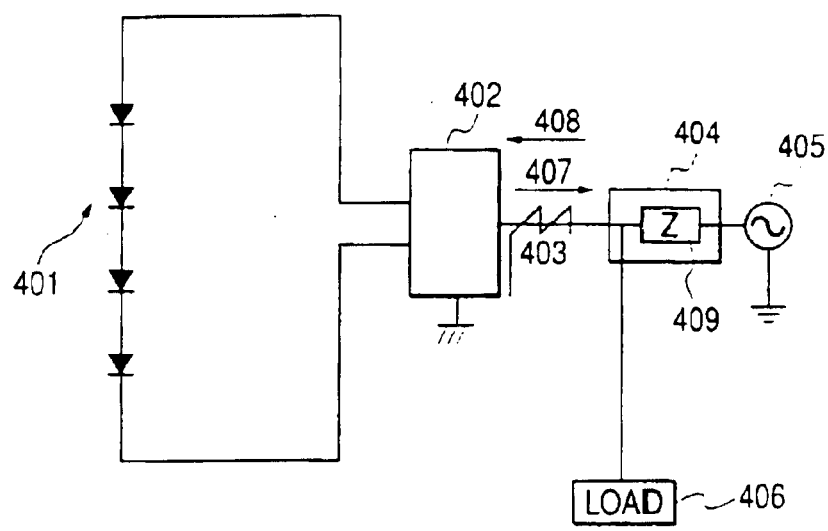
FIG. 4 is a circuit diagram of a photovoltaic power generation system that uses a power conditioner without an insulation transformer.

In addition, an example where the solar cells 1201 supported with the stand as shown in FIGS. 12A and 12B are connected in series to constitute a solar cell array is shown in FIG. 1. The solar cell array 101 shown in this figure is formed by connecting six stand-supported solar cells 1201 in series by using series connection members 102 that are made of copper and have no insulating coating, and has a positive electrode terminal 103 and a negative electrode terminal 104. Then, it is an example of connecting the positive electrode terminal 103 with the ground point 105.

Figure 13:
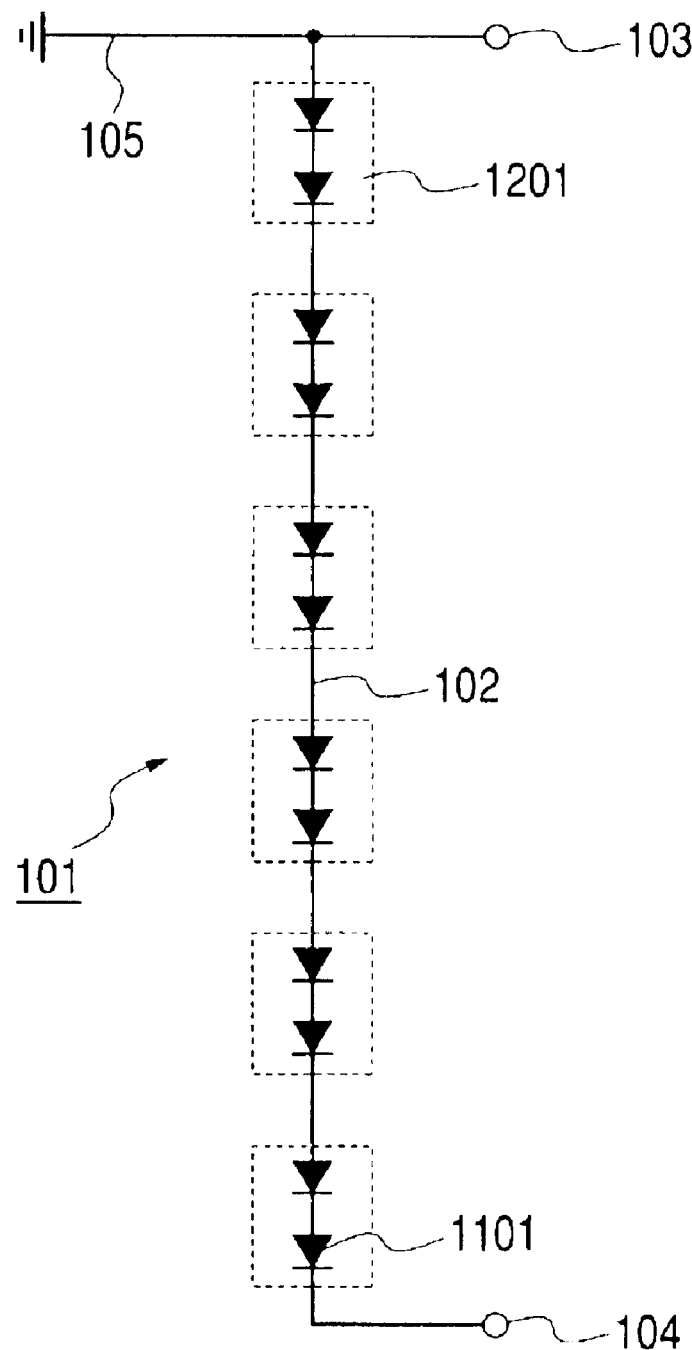
FIG. 13 is an equivalent circuit diagram of the solar cell array in FIG. 1.

FIG. 13 is an equivalent circuit diagram of the solar cell array 101 in FIG. 1. The solar cell array 101 consists of six sets of stand-supported solar cells 1201 connected in series with series connection members 102 (see FIGS. 12A and 12B), each set consisting of two solar cells 1101 (see FIGS. 11A and 11B) connected in series, and has the positive electrode terminal 103 and negative electrode terminal 104. Then, the solar cell array 101 is connected to the ground point 105 at the positive electrode terminal, and with letting a voltage of one sheet of solar cell be $v_0$ [volts], a voltage of the negative electrode terminal to the ground is $-12\ v_0$ [volts].

Hereafter, details of each component in the photovoltaic power generation system of the present invention will be explained.

(Solar Cell)

Figure 6A:
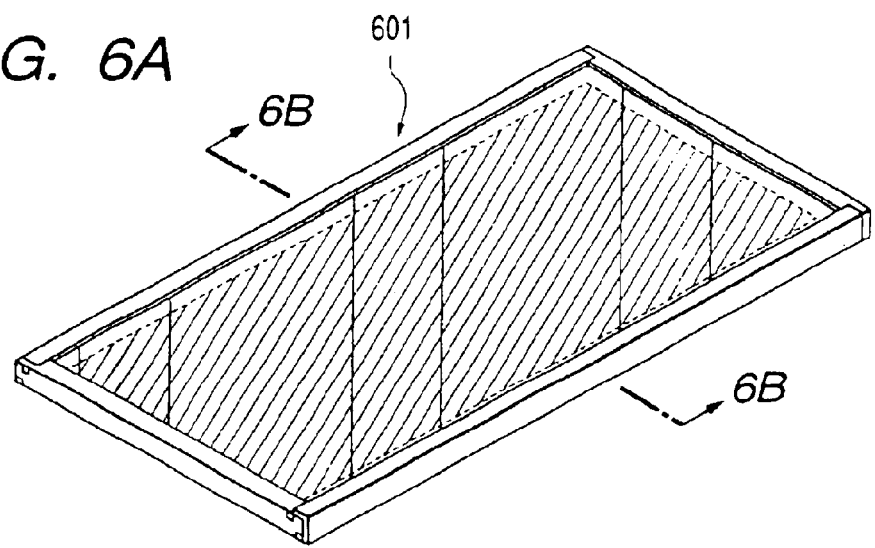
FIGS. 6A and 6B are a respective view and a sectional view showing one structural example of a solar cell module.
Figure 6B:
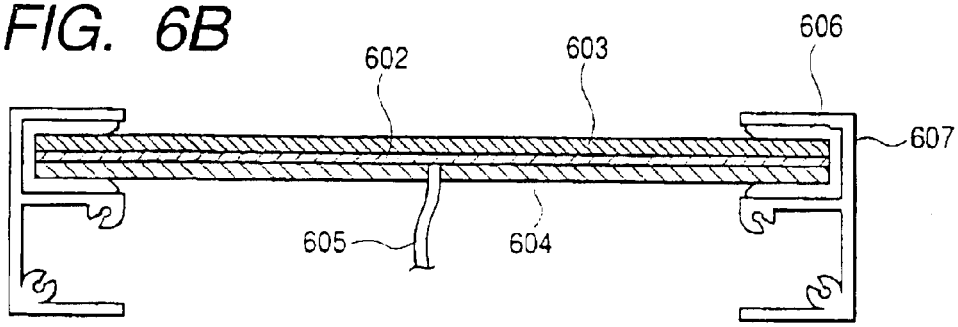

The solar cell array has an electroactive portion in an electrode of a solar cell or a wiring member that connects a plurality of solar cells, and at least a part of the electroactive portion may be exposed even after the solar cell array is constructed. Even when the solar cell array is formed by using conventional solar cell modules that have electrical insulation performance and are shown in FIGS. 6A and 6B, the present invention exhibits large effects so long as a part of the electroactive portion such as an output cable 605 for taking out the output of the array is exposed to the outside. In addition, when the solar cell array is formed by using solar cells not having electrical insulation performance as shown in FIGS. 11A and 11B, the present invention exhibits further large effects.

A material for the photoelectric conversion layer of the solar cell may be polycrystalline semiconductor including group IV elements such as Si, C and Ge, group IV element alloys such as SiGe and SiC, groups III–V compounds such as GaAs, InSb, GaP, GaSb, InP and InAs, groups II–VI compound such as ZnSe, CdTe, ZnS, CdS, CdSe and CdTe, and groups I–III–VI2 compounds such as $CuInSe_2$, $CuInS_2$ and $Cu(In, Ga)Se_2$. Also, it may be an amorphous semiconductor such as a-Si:H, a-SiGe:H and a-SiC:H. It may be a microcrystalline semiconductor.

In the case where the conventional solar cell module shown in FIGS. 6A and 6B is used to constitute a solar, cell array, the front cover 603 may be preferably an inorganic glass member, such as a white glass and a soda lime glass, or a member made of polycarbonate, acrylic resin, polystyrene or polyester resin. The thickness of the front cover, which varies with the characteristics of the material, is preferably equal to or more than 0.5 mm in general. A material of the back cover 604 may be, in addition to the materials of the front cover listed above, a synthetic resin, such as nylon, polyethylene terephthalate (PET) and polyvinyl fluoride (PVF), glass or metal plate. For the frame member 607, aluminum may be used. An internal circuit of such a solar cell module is completely insulated from the outside including the flame, and no line in the solar cell module is exposed to the outside. That is, all the members other than the wiring members are housed in the insulating envelope.

The non-insulated solar cell having the electroactive portion exposed as shown in FIGS. 11A and 11B is more advantageously used in this invention. While FIGS. 11A and 11B show the example of the amorphous silicon-based photovoltaic element provided on the metal substrate, it should be noted that this invention is not limited thereto, and photovoltaic elements having the above-described various photoelectric conversion layers may be used.

The coating member of the non-insulated solar cell does not cover the entire surface of the solar cell, and a minimum required part is covered therewith to prevent the power generation performance in the outdoor environment from being affected. Specifically, although varying according to the type of the photovoltaic element used, at least the portion having photoelectric conversion characteristics (i.e., active area) with respect to incident light in the photovoltaic element needs to be covered, but the other portions do not need to be covered.

For the coating member on the side of the light-receiving surface, a light-transmissive synthetic resin is bonded to the surface using an adhesive or pressure sensitive adhesive. Specifically, the material thereof may be fluorocarbon resin, acrylic resin, polyester or polycarbonate. More specifically, it may be polyvinylidene fluoride (PVdF), polyvinyl fluoride (PVF) or ethylene-tetrafluoroeyhylene copolymer (ETFE). Polyvinylidene fluoride is superior in, weatherability, and ethylene-tetrafluoroeyhylene copolymer is superior in compatibility between weatherability and mechanical strength and in transparency. In terms of cost, the thickness of the coating member is preferably 100 $\mu$m or less. Furthermore, in order to reduce the cost, an acrylic resin or fluororesin transparent paint may be preferably used instead of a film material. In this case, a coating method as generally used for application is adopted.

(Solar Cell Array)

A solar cell aggregate formed by connecting a plurality of above-mentioned solar cells in series or parallel so as to obtain desired output voltage and current is called a solar cell array. In addition, it is also good to have the structure of forming series bodies (solar cell strings) by connecting the solar cells in series once and connecting them in parallel so as to constitute the solar cell array.

(Ground Position)

So long as a ground position is a part electrically connected to a line (electric path) of a solar cell array, it is good anywhere. For example, the ground positions to be enumerated are a midpoint of the line of a solar cell array installed outdoors, a position just before drawing an output of the array to an input of a power conditioner, and a position where a terminal block is provided inside the power conditioner and its output is grounded while serving as grounding of the power conditioner.

(Serial/parallel Connection Member)

In order to form the solar cell array of the solar cells, it is required to connect the solar cells in series or parallel. A member for connecting the solar cells in series or parallel is referred to as a serial/parallel connection member. In the solar cell 1201 with a stand shown in FIGS. 12A and 12B and having two solar cells 1101 connected in series, no serial/parallel connection member is used, and the surface wiring member 1102 (FIGS. 11A and 11B) and the back wiring member of the respective solar cells 1103 (FIGS. 11A and 11B) are directly connected to each other. On the other hand, in the solar cell array 101 shown in FIG. 1, the serial/parallel connection member 102 is used to connect in series the solar cells 1201 with a stand. Furthermore, the wiring members leading to the positive and negative terminals in this drawing are also equivalent to the serial/parallel connection member.

For the serial/parallel connection member, a general-purpose insulated wire or insulated cable may be used. However, more preferably, a bare wire without an insulating coating is used. As the bare wire, a copper wire, a copper strand, a copper band and the like are preferably used.

(Electroactive Portion of Solar Cell Array and Its Exposure to Environment)

Even after the construction of the solar cell array is completed, at least a part of an electroactive portion of the solar cell array is exposed to an extent where people can touch it easily. Hence, for example, a connecting electrode of an insulation-coated connector that has been used for an electric connection of a solar cell module is not included. This is because it is not possible to touch the connecting electrode since connectors of adjoining solar cell modules are connected mutually after construction is completed for conductors (connecting electrodes) to be given waterproof processing completely though it is possible to touch the electrode of the connector during construction if a finger is inserted.

(Moist State)

The moist state means a state that differs from a dry state such as a fair weather, and a state that a current flows out from an electroactive portion to the ground since the electroactive portions of solar cells, wiring members, and series-parallel connection members get wet by rain water and resistance between the electroactive portion and ground decreases.

(Solar Cell Installation Structure)

In this specification, a solar cell installation structure means a structure formed by integrating a solar cell with series-parallel connection members and a supporting member (stand). It is possible to fix the solar cell on the supporting member with a fixing bracket or by direct bonding and fixation. When the supporting member is made of a heavy material such as concrete, it is possible to complete the arrangement of the supporting member (stand) only by placing the support member on the ground. In addition, though details will be described later, it is possible to constitute the fixing/supporting member for fixing a solar cell, such as a plate-like fixing/supporting member, and a back supporting member for installing this fixing/supporting member. In the structure having such a back supporting member, when the fixing/supporting member is similarly heavy, it is sufficient only to put the fixing, supporting member on the back supporting member. Such structure can make the solar cell installation structure simple in structure and good in workability.

(Supporting Member)

The supporting member means a member that fixes a solar cell, and generally, it is a member that forms a stand or an installation surface.

In the present invention, it is preferable to suitably use concrete material since the concrete material has simple structure and is easy in installation work. This is because, when the supporting member is made of a heavy material such as concrete, it is possible to complete the arrangement of the supporting member (stand) only by placing the support member on the ground. In addition, concrete is convenient to use it as a stand of a solar cell since the concrete is high in outdoor durability and is low in cost.

In addition, it is preferable to constitute the supporting member by separating the supporting member into a solar cell fixing member such as a plate-like fixing/supporting member and a back supporting member for installing this fixing/supporting member. This is convenient because an installation angle of the solar cell can be arbitrarily changed by arranging and leaning the plate-like fixing/supporting member on this back supporting member after installing, for example, the cubic back supporting member.

(Production Method of Concrete Supporting Member)

A concrete supporting member is produced by mixing, for example, Portland cement, sand, and gravel in proper proportions in a mold form made of wood, steel, or the like, adding proper quantity of water to the mixture, sufficiently mixing the mixture, pouring the mixture into a mold form, and hardening the mixture. The mold form includes a plywood mold form, a steel mold form, a coated plywood mold form, etc.

It is also good to bury a mesh reinforcing-steel in the center of a concrete plate before hardening in order to increase the strength of the concrete plate. In addition, a prestressed concrete plate in which a reinforcing steel given tension is buried is also acceptable.

The concrete supporting member is not limited to the above-mentioned, but autoclaved light-weight concrete such as ALC is also acceptable.

(Back Supporting Member)

A back supporting member is a member arranged on the back side of a fixing/supporting member (supporting member), and may be unnecessary according to a shape of the fixing/supporting member. Since this is used as a pillow member of the plate-like fixing/supporting member and a lift angle of a solar cell fixed to the fixing/supporting member can be changed arbitrarily, this can be used suitably. A rectangular shape or the like can be used as a shape for this. In general, since heavy material such as a concrete plate is used as a fixing/supporting member, the material having high compressive strength and high outdoor durability is suitable as the back supporting member. Specifically, for instance, concrete, stone, brick, or the like can be used as the material for this back supporting member.

(Photovoltaic Power Generation System)

Figure 14:
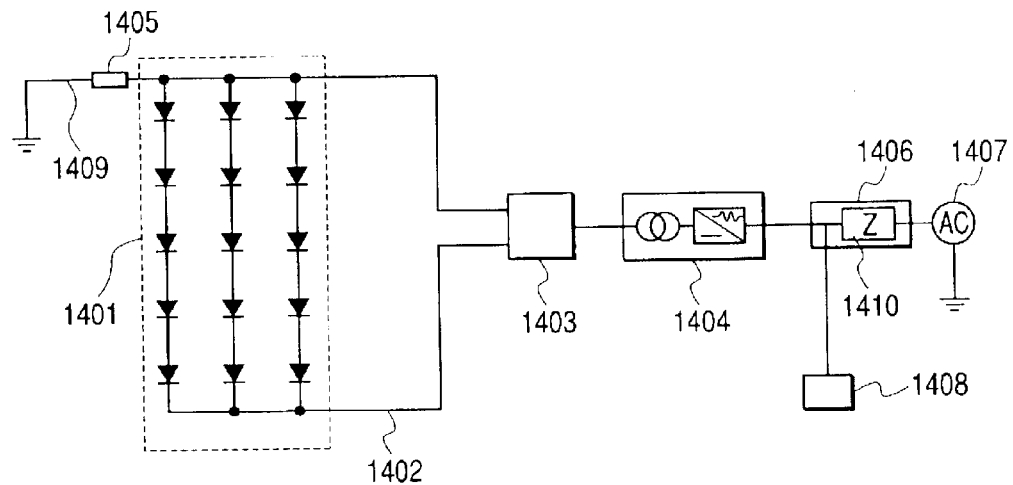
FIG. 14 is a circuit diagram showing an example of a photovoltaic power generation system of the present invention.

FIG. 14 is a schematic diagram for explaining a photovoltaic power generation system of the present invention. In FIG. 14, reference numeral 1401 denotes a solar cell array, 1402 does a series-parallel connection member, 1403 does a connection box, 1404 does a power conditioner with an insulation transformer, 1405 does a ground-fault detection sensor, 1406 does a switchboard, 1407 does a system (power system), 1408 does a load, 1409 does a grounding line, and 1410 does a ground-fault interrupter in the switchboard installed in a receiving terminal.

The photovoltaic power generation system of the present invention can be constituted by performing such wiring in FIG. 14. In addition, in the photovoltaic power generation system of the present invention, first of all, the electric power generated in the solar cell array 1401 is collected in the connection box 1403, and is given DC-AC conversion by the power conditioner 1404 with an insulation transformer to be sent to the load 1408 through the switchboard 1406. Here, if there is surplus electric power owing to large electric power generation, it is also possible to transmit electricity to the system (power system) 1407 and sell the electric power to an electric power company. On the contrary, if the electric power generation is low and there is a lot of power consumption in the load 1408, it is possible to buy electric power from the electric power company by supplementing a shortfall from the system (power system) 1407.

In this embodiment, a positive electrode terminal that is one of the lines of the solar cell array 1401 is grounded through the grounding line 1409, and a ground-fault detector (ground-fault detection sensor 1405) is provided in this grounding line.

(Set Current Values of Ground-fault Detector and Ground-fault Interrupter)

In the photovoltaic power generation system of the present invention, when a current route is formed from an electroactive portion to the ground during the operation of a solar cell array in a moist state, and when a current Ir [A] flows from this electroactive portion to the ground, it is preferable to set the set current value of the ground-fault detector larger than Ir, and to set the set current value of the ground-fault interrupter smaller than Ir. This will be specifically explained below with referring to FIG. 8.

Figure 8:
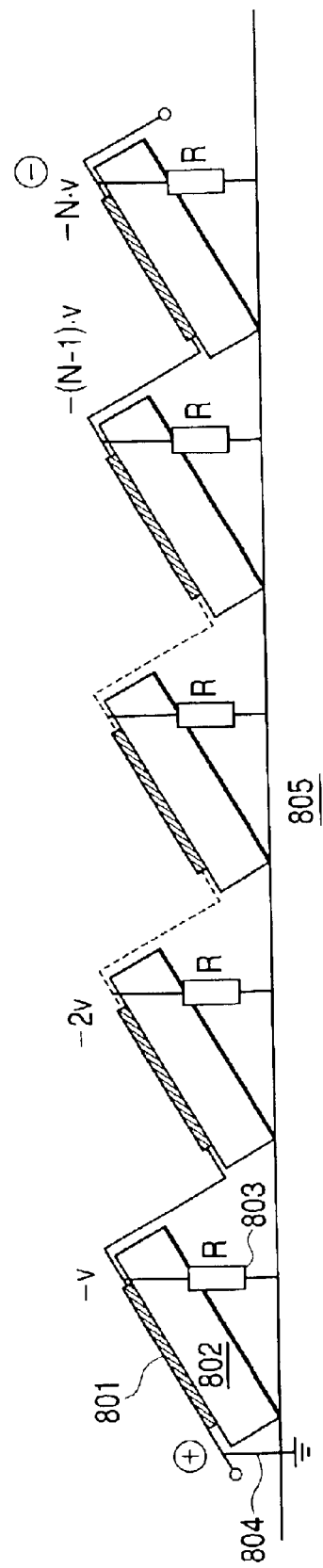
FIG. 8 is a view for explaining a formula of a leakage current in a solar cell array with a stand according to the present invention.
Figure 9:
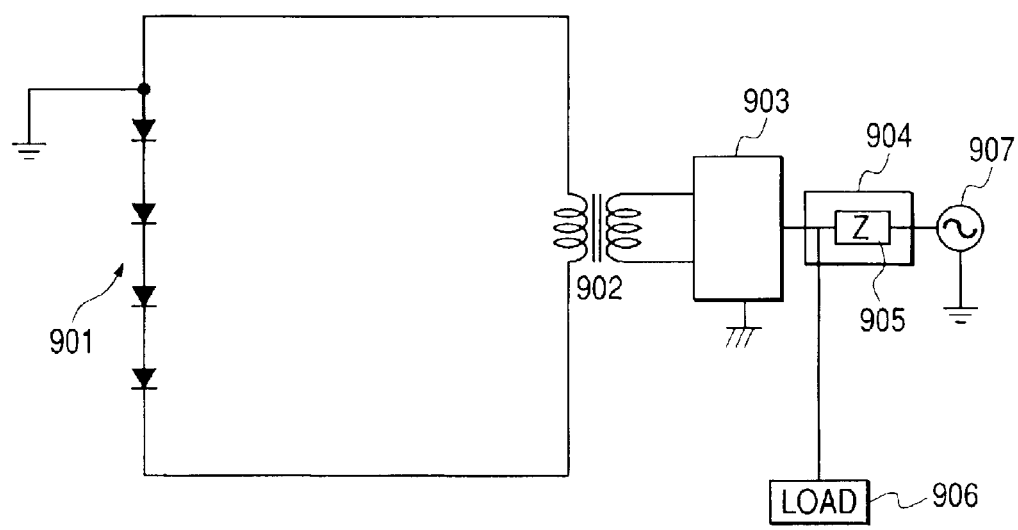
FIG. 9 is a diagram showing that a solar cell array and a system (power system) are insulated by an insulation transformer.

In FIG. 8, reference numeral 801 denotes a solar cell, 802 does a solar cell installation structure, 803 does a resistor between the solar cell and ground, 804 does a grounding line, and 805 does the ground. The shown solar cell array is formed by serially connecting the solar cell installation structures 802 each having the solar cell 801, and is an example of grounding its positive electrode terminal output to the ground 805 with the grounding line 804.

When a voltage between the solar cells 801 connected in series is v (volt), a number of series of solar cell installation structures 802 of the solar cell array is N, a resistance between the electroactive portion and ground in a moist state of the solar cell and/or the wiring member is R(Ω), and a leakage current between the electroactive portion and ground in the moist state of the solar cell array is Ir {A}. The following equation is obtained.

$$Ir = |\{-N \cdot v/R\} + \{-(N-1)v/R\} + \{-(N-2)v/R\} + \ldots +$$
$$\{-2v/R\} + \{-v/R\}|$$
$$= |-v \cdot N \cdot (N+1)/2R|$$

Hence, the set current value of the ground-fault detector in the photovoltaic power generation system that has the solar cell array shown in FIG. 8 is set larger than $|-v \cdot N \cdot (N+1)/2R|$ and the set current value of the ground-fault interrupter is set smaller than $|-v \cdot N \cdot (N+1)/2R|$.

(Power Conditioner)

A power conditioner used for the present invention is an insulated type (which is a conditioner incorporating a transformer). The kinds of this type are as follows.

(1) Commercial-frequency transformer-insulated type of power conditioner:

A power conditioner that is insulated with a transformer after a DC output from a solar cell array is converted into a commercial-frequency AC voltage.

(2) High-frequency transformer-insulated type of power conditioner:

A power conditioner that is insulated with a small high-frequency transformer after converting a DC output from a solar cell array into a high-frequency AC voltage, after that, converts the high-frequency AC voltage into a DC voltage once, and converts the DC voltage into a commercial-frequency AC voltage again.

(Leakage Current)

A leakage current means a current that flows into the ground through a route, which has not been determined beforehand, since the insulation resistance of an electroactive portion having potential to the ground decreases due to a moist state.

(Ground-fault Current)

A ground-fault is that an output line of a solar cell array or an inside or outside line of a solar cell module contacts with the ground due to an accident or the like, and an output of the solar cell connects to the ground in low resistance.

Figure 10:
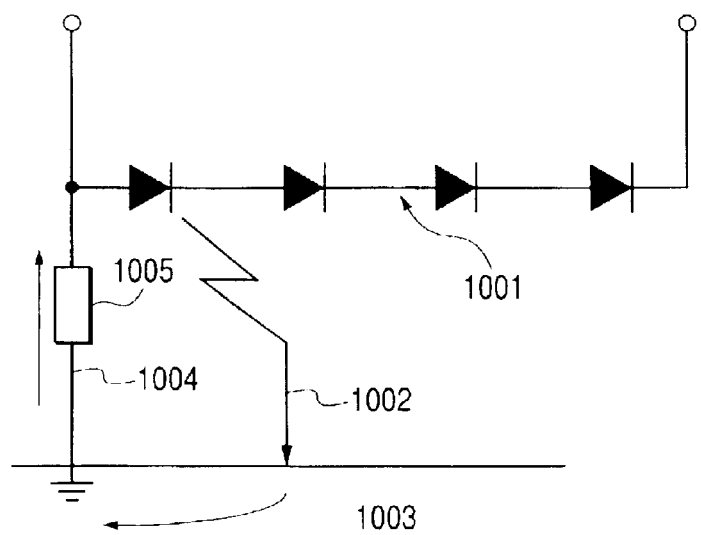
FIG. 10 is a diagram showing a route in the present invention where a leakage (ground-fault) current flows.

In the case of a solar cell array according to the present invention, as shown in FIG. 10, since both of a leakage current 1002 and a ground-fault current form each small loop current through a route of (solar cell 1001)→(ground 1003)→(grounding line 1004), a difference between them appears only in the difference between loop current values.

In the present invention, the ground-fault current caused by an accident etc. is larger than the leakage current.

In addition, though the set current value of the ground-fault detector 1005 explained below is larger than that of the leakage current, it is smaller than that of the ground-fault current. Hence, a ground-fault by a ground-fault accident that arises in the solar cell array is detected by the ground-fault detector, and stops the power conditioner in the photovoltaic power generation system to make the solar cell array drop out of the system.

(Ground-fault Detector)

This ground-fault detector detects a ground-fault current to the ground that exceeds the set current value set beforehand, and stops a power conditioner in a photovoltaic power generation system to make the power conditioner drop out of the system.

A suitable ground-fault detector used for the present invention is a detector using a DC current sensor. This DC current sensor is provided in a grounding line that connects a solar cell array line and the ground.

The DC current sensor is constituted of an iron core with a gap and a Hall element. A magnetic flux proportional to a penetration current that passes an iron wire is converged by the core, and penetrates through the Hall element inserted in the gap to generate a voltage by the Hall effect. Since the voltage is a function of the penetration current, it is possible to measure a value of the flowed current by detecting the voltage.

(Ground-fault Interrupter in Electricity Receiving Terminal)

This ground-fault interrupter is installed in an electricity-receiving terminal (distribution board), and monitors ground-faults of indoor wirings and load equipments.

This interrupter detects a leakage current from wiring and an electric appliance, and detects a ground-fault in a customer's site to interrupt connection between the inside and outside of the customer's site so that its influence does not spread to the distribution system that is outside the customer's site.

Figure 5:
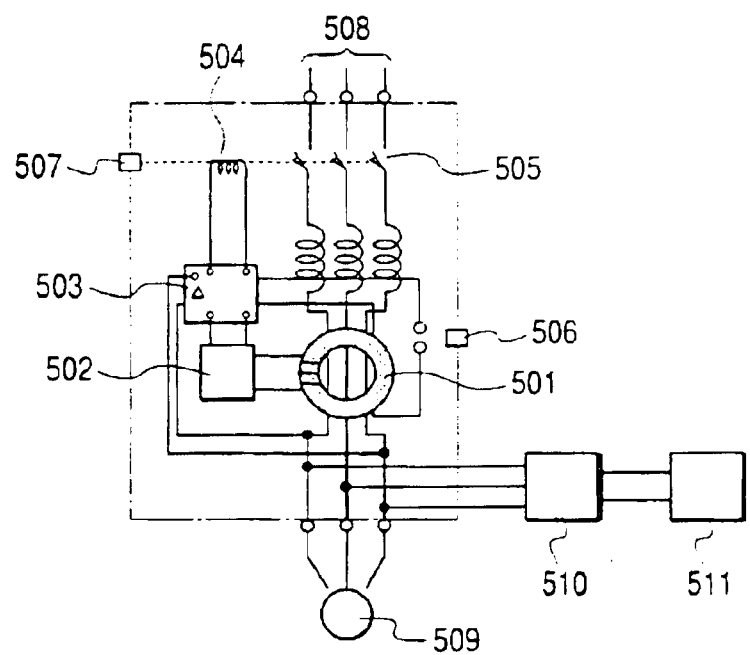
FIG. 5 is a diagram showing the structure of a ground-fault interrupter and the connection with a load.

A ground-fault interrupter for receiving electricity is shown in FIG. 5. In FIG. 5, reference numeral 501 denotes a zero-phase-sequence current transformer, 502 does a sensitivity switching device, 503 does an amplifier, 504 does a coil, 505 does an opening and closing mechanism, 506 does a test button, 507 does leak display panel, 508 does a system side power circuit, and 509 does a load.

The zero-phase-sequence current transformer 501 detects a differential current between an outgoing current from the system side and a returning current from the load, and when a leak arises, that is, the differential current is equal to or larger than a sensitivity current, its line is interrupted by the interrupter. Though the ground-fault interrupter can set a current and operation time, it is provided in standards that the current shall be 0.1 A or less.

Hereafter, though the present invention will be explained in examples in further detail, the present invention is never limited to these examples.

EXAMPLE 1

An example of constructing a photovoltaic power generation system shown in FIG. 15 will be explained as Example 1 of the present invention. In Example 1, a positive electrode terminal of a solar cell array is grounded.

Figure 15:
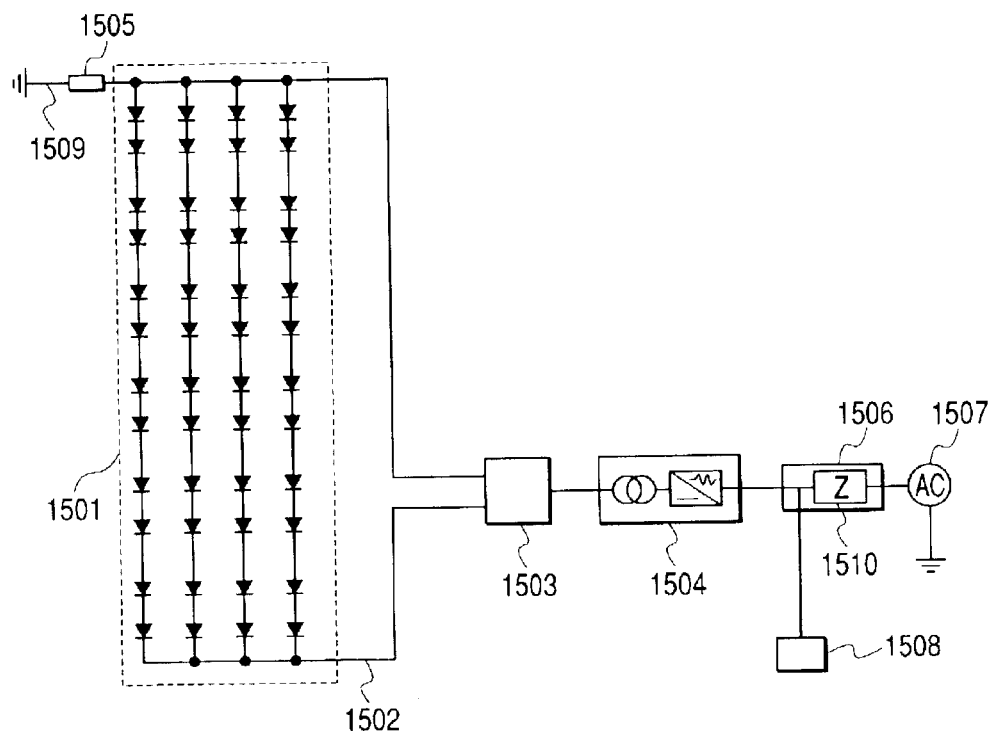
FIG. 15 is a circuit diagram of the photovoltaic power generation system in Example 1.

In FIG. 15, reference numeral 1501 denotes a solar cell array, 1502 does a series-parallel connection member, 1503 does a connection box, 1504 does a power conditioner with an insulation transformer, 1505 does an ground-fault detector, 1506 does a switchboard, 1507 does a system (power system), 1508 does a load, 1509 does a grounding line, and 1510 does a ground-fault interrupter.

In this example, four solar cell arrays are arranged in parallel as shown in FIG. 15, and are connected to the power conditioner 1504 with an insulation transformer to be further connected to the system (power system) 1507. Since the completed photovoltaic power generation system uses the non-isolated type solar cells as mentioned above, it is possible to construct a photovoltaic power generation system that is lower in cost in comparison with a conventional photovoltaic power generation system. Each structure will be described below in detail.

(Solar Cell Array)

An amorphous silicon-based photovoltaic element shown in FIGS. 11A and 11B is used as a solar cell. An open circuit voltage per solar cell in a normal condition is 2 V, and an optimal operating voltage is 1.5 V. In addition, the solar cell is a non-isolated type solar cell since a surface wiring member 1102, a back wiring member 1103, and a metal plate 1106 are not put in an envelope for insulation as shown in the figures.

First of all, two sheets of solar cells are serialized as shown in FIGS. 12A and 12B. At this time, the surface wiring members 1102 and back wiring members 1103 of adjoining solar cells 1101 are connected by soldering. In addition, two solar cells that are connected in series are bonded on the back supporting member 1203 with an elasticity epoxy adhesive 1204 as shown in the figures. At this time, since a part of the metal plate 1106 and back wiring member 1103 of the solar cell 1101 contacts with the back supporting member 1203 made of concrete, the concrete is not insulated from a solar cell circuit.

Next, six stand-supported solar cells 1201 as are shown in FIGS. 12A and 12B are connected in series as shown in FIG. 1. A bare copper belt (1 mm thick×12 mm wide) is used for series connection.

(Power Conditioner)

As the power conditioner 1504 used in this example, a high-frequency transformer-insulated type of power conditioner is adopted.

(Positive Electrode Grounding Line)

A copper belt between the stand-supported solar cells at a positive electrode terminal is grounded. The grounding is a D-type grounding, and its resistance to ground is 20Ω.

(Installation of Ground-fault Detector)

As the ground-fault detector 1505 for detecting a ground-fault current, a DC current detector is installed on the positive electrode grounding line 1509 that connects a positive electrode terminal output and the ground, and the output is connected to the detector that is incorporated in the power conditioner.

(Measurement of Resistance between Solar Cell and Ground)

Figure 16:
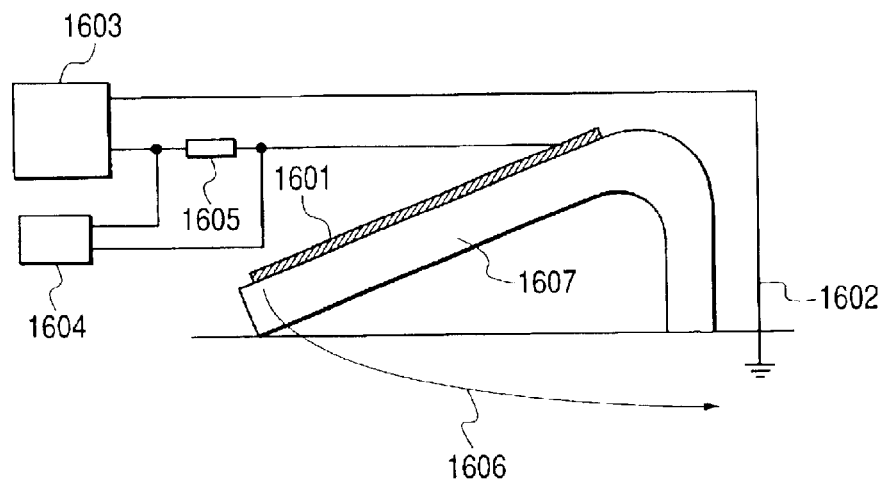
FIG. 16 is an explanatory diagram of measurement of resistance between the solar cell and ground in Example 1.

FIG. 16 is a schematic diagram for explaining the measurement of resistance between the solar cell in a solar cell with a stand and the ground. In FIG. 16, reference numeral 1601 denotes a solar cell, 1602 does a grounding metal rod, 1603 does constant-voltage power supply, 1604 does a digital multimeter, 1605 does a shunt resistor, and 1606 does a leakage current.

As shown in FIG. 16, the positive and negative electrodes of the solar cell 1601 were short-circuited, a voltage was applied from a constant-voltage power supply 1603 between the location and the ground (grounding metal rod 1602), and a voltage between both terminals of the shunt resistor 1605 was monitored by a digital multimeter 1604 for detecting a leakage current 1606 that flowed at that time. In addition, each measurement wiring material used was an IV line of 2 mm$^2$. Furthermore, the ground resistance of the grounding metal rod 1602 to be used was 10Ω.

On the supporting member 1607, a solar cell (outside dimensions are 240 mm×360 mm) was bonded and fixed with an adhesive, the positive and negative electrodes were short-circuited when applying a voltage, and the voltage was applied between the short-circuit portion and grounding metal rod 1602. Application conditions of the voltage were made to be 50 V, 100 V, 200 V, and 300 V. In addition, the shunt resistor 1605 to be used was a resistor of 1Ω.

Values of the applied voltage and leakage current that were obtained in this measurement have a relation expressed in a linear function, that is, a straight line in accordance with Ohm's law. It is possible to find the resistance between the solar cell and the ground from this inclination of the straight line. In addition, so as to make conditions worst, the measurement was performed after sufficient quantity of city water (conductivity: 150 μS/m) had been poured on the supporting member, solar cell, and back supporting member. By the way, since the conductivity of general rain water is 10 to 100 μS/m, this experiment was under severer conditions, that is, under very conductive conditions.

The resistance between the solar cell and the ground per solar cell installation structure was 650Ω according to this measuring method.

(Calculation of Leakage Current Value)

The followings are premises:

Optimal operating voltage per solar cell: v=1.5 [volts]

Number of serial solar cells on solar cell installation structure: N=12

Resistance between solar cell and ground per solar cell installation structure: R=650[Ω]

Leakage current between solar cell and ground: Ir [A]

Supposing the solar cell installation structure is serialized and the positive electrode terminal is grounded, $$Ir = |\{-N \cdot v/R\} + \{-(N-1)v/R\} + \{-(N-2)v/R\} + \ldots + \quad (A)$$
$$\{-2v/R\} + \{-v/R\}|$$
$$= |-v \cdot N \cdot (N+1)/2R|$$
$$= |-1.5 \times 12 \times 13/(2 \times 650)|$$
$$= 0.18$$

Since four solar cell arrays are in parallel, a total leakage current is calculated as 0.18×4=0.72 (A).

(Setting of Ground-fault Detector)

A DC current detector that is the ground-fault detector 1505 was arranged in a grounding line between the positive electrode terminal and ground, and the ground-fault detection current was set at 0.75 A. (When a current equal to or more than 0.75 A flows, detection is carried out.)

(Ground-fault Interrupter)

A leak detection current of the ground-fault interrupter 1510 was set at 30 mA. In this manner, the set current value of the ground-fault interrupter was set lower than a set current value of the ground-fault detector.

Since the set current value of the ground-fault detector is larger than a calculated value of the leakage current, a ground-fault current can be detected by the ground-fault detector without malfunctioning due to the leakage current from the solar cell array.

In addition, though the set current value of the ground-fault interrupter is smaller than the set current value of the ground-fault detector, the ground-fault interrupter 1510 never interrupts the circuit by the leakage current of the solar cell array since the insulation transformer is used in the circuit.

Moreover, since the ground-fault detector 1505 is installed in the grounding line 1509 of the solar cell array, it is possible to easily detect the ground-fault current from the solar cell array 1501. In addition, since the solar cell array 1501 is connected to the system (power system) through the insulation transformer, the ground-fault current never flows into the system (power system), and hence, this structure exhibits an excellent effect of not having bad influence on the system.

(Effects of Positive Electrode Grounding)

When a solar cell array where an electroactive portion was exposed like this example was used, there arose a problem that metal ions that constitute the electroactive portion flowed out from the electroactive portion, and the corrosion of an electrode, a wiring member or a series-parallel connection member was promoted. In particular, it was found that, when copper was used for the series-parallel connection member, the copper was ionized by forming a current route and elution was remarkable, and hence, the life time of the connection members decreases greatly.

Therefore, in the solar cell array that has an exposed electroactive portion in a solar cell and/or a wiring member that electrically connects the solar cell, there arises a problem that a leakage current route arises between the ground and the electroactive portion of the solar cell array in a moist state during rainfall and after the rainfall, as a result, metal ions flow out from the wiring member (if series-parallel connection members connecting solar cells in series and parallel is a conductor not covered with an insulating material, the conductor is included), and the corrosion of the wiring member (or, the above-mentioned series-parallel connection members) is promoted. The present invention prevents this corrosion by line grounding of a positive electrode terminal output of the solar cell array.

Figure 7:
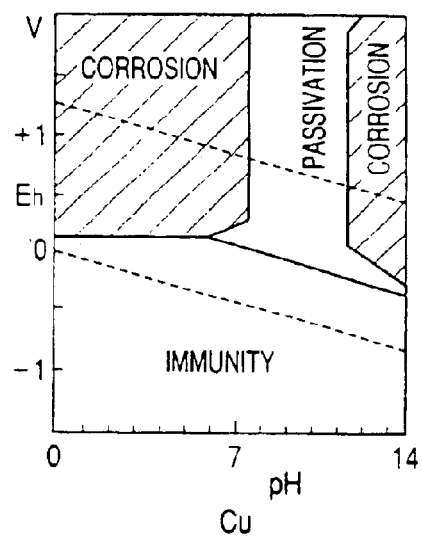
FIG. 7 is a potential-pH diagram for copper.

That is, when the line grounding of the positive electrode terminal output of the solar cell array is performed, the electroactive portion of the solar cell array becomes zero potential or negative potential to the ground, and hence, it is possible to prevent the corrosion of the wiring member etc. from being promoted. For example, a potential-pH diagram for copper (Cu) at the time when copper is used as a wiring member etc. is shown in FIG. 7. As seen from FIG. 7, when positive electric potential is applied, copper is eluted in a whole pH region. Therefore, so long as the copper that constitutes the wiring member etc. is kept to be zero or negative potential to the ground, it is possible to prevent the elution of the copper.

Since all electroactive portions of the solar cell array become negative potential by grounding the positive electrode terminal like this example, it is possible to prevent the corrosion of the exposed electroactive portion of the wiring member etc.

EXAMPLE 2

An example of constructing a photovoltaic power generation system shown in FIG. 17 will be explained as Example 2 of the present invention. Example 2 is an example of grounding a line at a position where a ratio of absolute values of ground voltages of the positive electrode terminal and the negative electrode terminal of the solar cell array become approximately 2:1.

Figure 17:
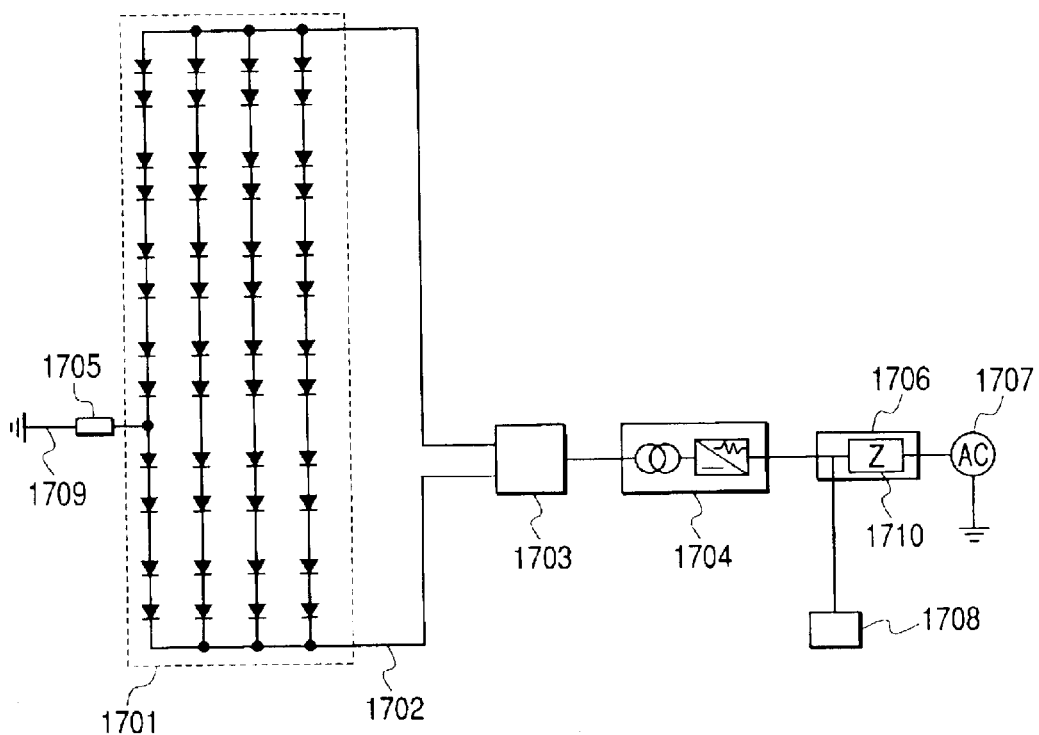
FIG. 17 is a circuit diagram of a photovoltaic power generation system in Example 2.

In FIG. 17, reference numeral 1701 denotes a solar cell array, 1702 does a series-parallel connection member, 1703 does a connection box, 1704 does a power conditioner with an insulation transformer, 1705 does an ground-fault detector, 1706 does a switchboard, 1707 does a system (power system), 1708 does a load, 1709 does a grounding line, and 1710 does a ground-fault interrupter.

In this example, four solar cell arrays are arranged in parallel as shown in FIG. 17, and are connected to the power conditioner 1704 with an insulation transformer to be further connected to the system (power system) 1707. Since the completed photovoltaic power generation system uses the non-isolated type solar cells as mentioned above, it is possible to construct a photovoltaic power generation system that is lower in cost in comparison with a conventional photovoltaic power generation system. Each constituent will be described below in detail.

(Solar Cell Array)

Similarly to Example 1, an amorphous silicon-based photovoltaic element shown in FIGS. 11A and 11B is used as a solar cell.

First of all, similarly to Example 1, two sheets of solar cells are serialized as shown in FIGS. 12A and 12B.

Next, six stand supported solar cells 1201 as shown in FIGS. 12A and 12B are connected in series as shown in FIG. 1. A bare copper belt (1 mm thick×12 mm wide) is used for the series connection.

(Power Conditioner)

As the power conditioner 1604 used in this example, a high-frequency transformer-insulated type of power conditioner is adopted.

(Grounding Line)

As shown in FIG. 17, a copper belt between stand-supported solar cells is grounded at a position where a ratio of absolute values of ground voltages of the positive electrode terminal and the negative electrode terminal of the solar cell string becomes approximately 2:1. The grounding is D-type grounding, and its resistance to ground is 20Ω. The grounding position is between the fourth and the fifth stand-supported solar cells from the positive electrode terminal.

(Installation of Ground-fault Detector)

As the ground-fault detector 1705 for detecting a ground-fault current, a DC current detector is installed on the grounding line 1709 that connects the line of the solar cell array and the ground, and its output is connected to the ground-fault detector that is incorporated in the power conditioner.

(Measurement of Resistance between Solar Cell and Ground)

FIG. 16 is a schematic diagram for explaining the measurement of resistance between the solar cell and the ground in a solar cell with a stand. According to measurement similar to Example 1, the resistance between the solar cell and the ground per solar cell installation structure was 650Ω according to this measuring method.

(Calculation of Leakage Current Value)

The followings are premises:

Optimal operating voltage per solar cell: v=1.5 [volts]

Number of serial solar cells on solar cell installation structure: N=12

Resistance between solar cell and ground per solar cell installation structure: R=650[Ω]

Leakage current between solar cell and ground: Ir [A]

In the case that solar cell installation structures are serialized and the line is grounded at a position where a ratio of absolute values of ground voltages of the positive electrode terminal and the negative electrode terminal of the solar cell array become approximately 2:1, a leakage current is:

$$Ir = |\{8 \cdot v/R\} + (7 \cdot v/R) + \ldots + (2 \cdot v/R) + \{v/R\} + \ldots + \quad (A)$$
$$(-v/R) + (-2 \cdot v/R) + \ldots + (-4 \cdot v/R)|$$
$$= |(8+7+6+5) \times v/R|$$
$$= |26 \cdot 1.5/650|$$
$$= 0.06$$

Since four solar cell arrays are in parallel, a total leakage current is calculated as 0.06×4=0.24 (A).

(Setting of Ground-fault Detector)

A DC current detector that was the ground-fault detector 1705 was arranged in the grounding line, and the ground-fault detection current was set at 0.25 A. (When a current equal to or more than 0.25 A flows, detection is carried out.)

(Ground-fault Interrupter)

A leak detection current of the ground-fault interrupter 1710 was set at 30 mA. In this manner, the set current value of the ground-fault interrupter was set lower than the set current value of the ground-fault detector.

Since the set current value of the ground-fault detector is set larger than the calculated value of the leakage current, a ground-fault current can be detected by the ground-fault detector without malfunctioning due to the leakage current from the solar cell array.

In addition, though the set current value of the ground-fault interrupter is smaller than the set current value of the ground-fault detector, the ground-fault interrupter 1710 never interrupts the circuit according to the leakage current of the solar cell array since the insulation transformer is used in the circuit.

Moreover, since the ground-fault detector 1705 is installed in the grounding line 1709 of the solar cell array, it is possible to easily detect the ground-fault current from the solar cell array 1701. In addition, since the solar cell array 1701 is connected to the system (power system) through the insulation transformer, the ground-fault current never flows into the system (power system), and hence, this structure exhibits an excellent effect of not having bad influence on the system.

(Effects of 2:1 Grounding)

With the above-described requirement with the electrical insulation performance being excluded therefrom according to the present invention, as expected as a matter of course, safety should be ensured because an insulation resistance between the solar cell array circuit and the ground is small, and the charging line of the solar cell array is exposed. Therefore, it is a major premise that such a photovoltaic power generation system having an exposed charging part can be installed in a controlled area to which those other than an administrator are forbidden to enter. Furthermore, the inventors have investigated auxiliary means as an additional measure for safety and noted the IEC standard 60479-1: "Effects of Current on Human Beings." According to this, for a direct current, a human body is affected substantially the same in the cases where the current flows from the ground to an upper part of the human body and where double the current thereof flows from the upper part of the human body to the ground. That is, if a resistance of the human body is constant, the cases are substantially equivalent where a human body touches a negative potential with a hand and where the human body touches a positive potential twice as high as the negative potential.

The present inventors paid attention to this, and found that, so long as a grounding position of a solar cell array is determined so that the relation of "absolute value of maximum positive electric potential≧absolute value of maximum negative electric potential" may hold, it is possible to improve safety. Then, effects caused by adopting the grounding position in this example will be described by using FIG. 19.

Figure 19:
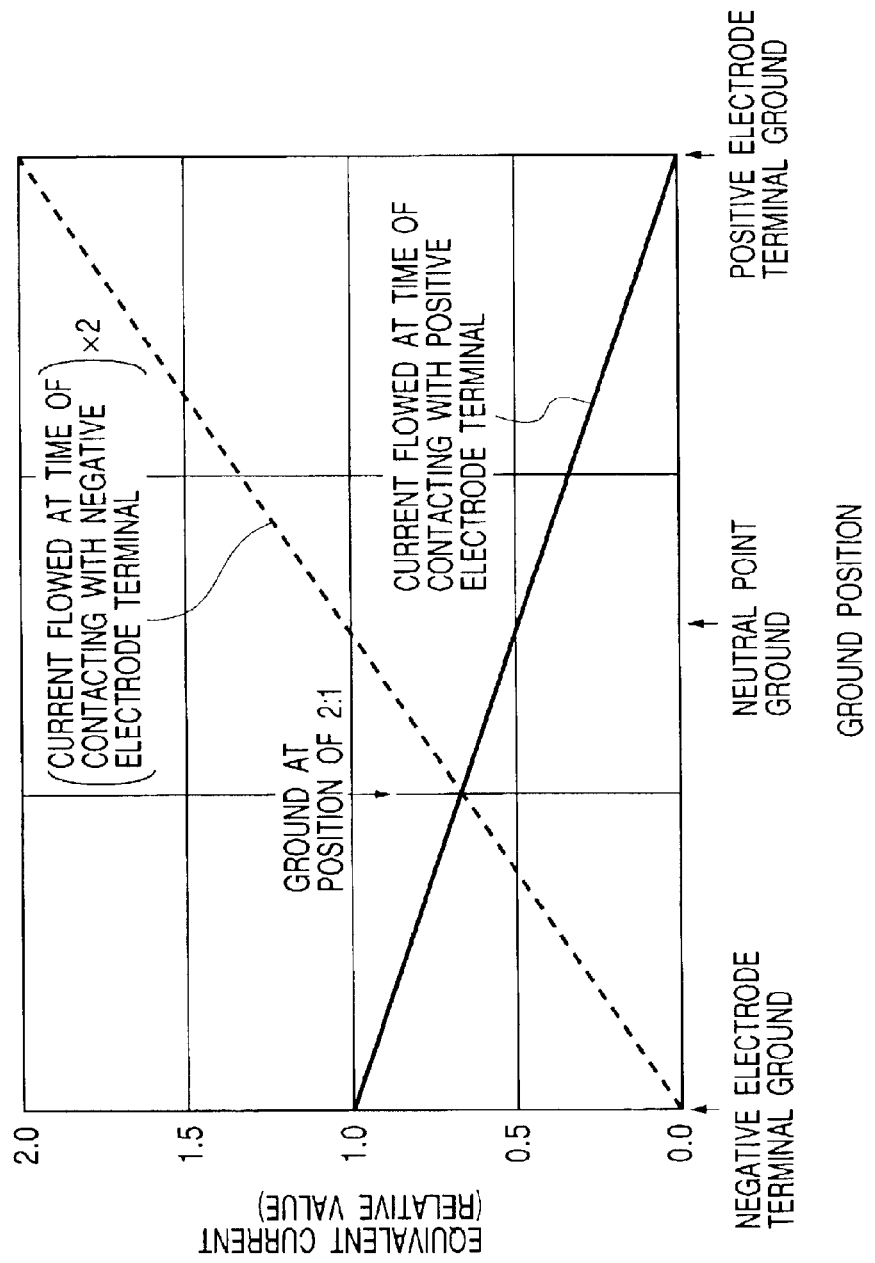
FIG. 19 is a graph showing a current that flows into a human body for the ground point of a solar cell string.

A position where the line of the solar cell string is grounded can be any position between the negative and positive terminals of the string. The negative or positive potential of the line with respect to the ground becomes higher as the line point becomes closer to the positive or negative terminals from the ground point having the same potential with the earth or the ground point. Therefore, regardless of the grounding point, it can be said that the maximum absolute value of the voltage to ground is attained at either the negative terminal or the positive terminal of the string. Thus, only for the case where a part of a human body comes into contact with the negative and positive terminals, a current flowing into the human body is to be investigated. If the resistance of the human body is constant, the current flowing therethrough is in proportion to the amplitude of the potential at a part to be touched. Thus, when the human body touches the positive terminal, the current is zero if the positive terminal is grounded, and is at the maximum if the negative terminal is grounded, as indicated by a solid line in FIG. 19. As described above, in terms of influence on a human body, the current that flows when the human body touches the negative potential is equivalent to substantially double the current that flows when the human body touches the positive potential. Therefore, a comparison between the current that flows when the positive terminal is touched with the current that flows when the negative potential is touched in terms of the influence on the human body can be made by doubling the value of the latter current. A broken line in FIG. 19 is a plot of the doubled value of the current flowing when the human body touches the negative terminal. The equivalent current that flows in this case is zero if the negative terminal is grounded, and is at the maximum if the positive terminal is grounded, the maximum value being twice as large as the current that flows if the positive terminal is touched when the negative terminal is grounded. As can be clearly seen from FIG. 19, at any grounding point, concerning a larger one of the equivalent currents that flow through the human body when the positive terminal or the negative terminal is touched, it is smaller when the grounding is provided between the negative terminal and the middle point than when the grounding is provided between the middle point and the positive terminal. It is also shown that the larger one of the equivalent currents that flow through the human body when the positive terminal and the negative terminal are touched is at the minimum when the grounding is provided at a position where the ratio of the absolute value of the voltage to ground of the positive terminal to that of the negative terminal is substantially 2 to 1 ("ground at a point of ratio 2 to 1", in FIG. 19).

Hence, safety becomes the highest by grounding the line at a position where a ratio of absolute values of ground voltages of the positive electrode terminal and the negative electrode terminal of the solar cell array becomes approximately 2:1 like this example.

EXAMPLE 3

An example of constructing a photovoltaic power generation system shown in FIG. 18 will be explained as Example 3 of the present invention. Example 3 is an example of grounding a negative electrode terminal of a solar cell array.

Figure 18:
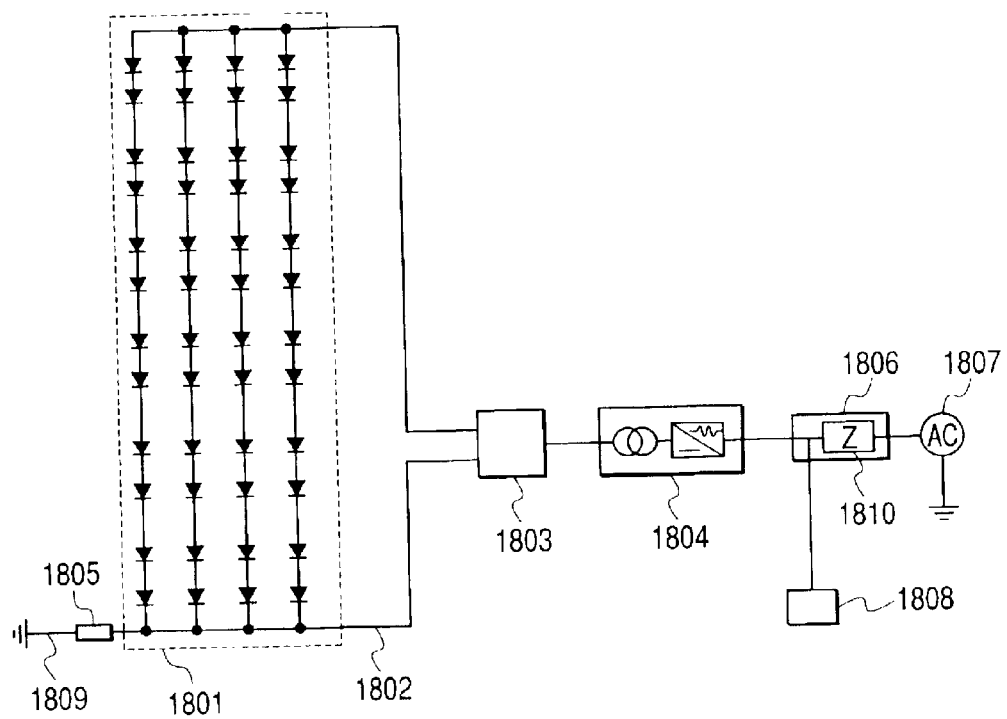
FIG. 18 is a circuit diagram of a photovoltaic power generation system in Example 3.

In FIG. 18, reference numeral 1801 denotes a solar cell array, 1802 does a series-parallel connection member, 1803 does a connection box, 1804 does a power conditioner with an insulation transformer, 1805 does an ground-fault detector, 1806 does a switchboard, 1807 does a system (power system), 1808 does a load, 1809 does a grounding line, and 1810 does a ground-fault interrupter.

In this example, the grounding position in Example 1 is changed to a negative electrode terminal, and besides it, the other points are the same as in Example 1.

Hereafter, points different from Example 1 will be described.
(Grounding Line)

A copper belt between the stand-supported solar cells at a negative electrode terminal is grounded. The grounding is a D-type grounding, and resistance to ground is 20Ω.
(Installation of Ground-fault Detector)

As the ground-fault detector 1505 for detecting a ground-fault current, a DC current detector is installed on the positive electrode grounding line 1809 that connects a negative electrode terminal output and the ground, and the output is connected to the ground-fault detector that is incorporated in the power conditioner.
(Measurement of Resistance between Solar Cell and Ground)

A measuring method was the same as that in Example 1, and the resistance between the solar cell and the ground per solar cell installation structure was 650Ω.
(Calculation of Leakage Current-value)

The followings are premises:

Optimal operating voltage per solar cell: v=1.5 [volts]

Number of serial solar cells on solar cell installation structure: N=12

Resistance between solar cell and ground per solar cell installation structure: R=650[Ω]

Leakage current between solar cell and ground: Ir [A]

Supposing the solar cell installation structures are serialized and the negative electrode terminal is grounded, $$Ir = |\{N \cdot v/R\} + \{(N-1)v/R\} + \{(N-2)v/R\} + \ldots +  \quad (A)$$
$$\{2v/R\} + \{v/R\}|$$
$$= |v \cdot N \cdot (N+1)/2R|$$
$$= |1.5 \times 12 \times 13/(2 \times 650)|$$
$$= 0.18$$

Since four solar cell arrays are in parallel, a total leakage current is calculated as 0.18×4=0.72 (A).
(Setting of Ground-fault Detector)

A DC current detector that is the ground-fault detector 1805 was arranged in a grounding line between the positive electrode terminal and ground, and the ground-fault detection current was set at 0.75 A. (When a current equal to or more than 0.75 A flows, detection is carried out.)
(Ground-fault Interrupter)

A leak detection current of the ground-fault interrupter 1810 was set at 30 mA. In this manner, the set current value of the ground-fault interrupter was set lower than a set current value of the ground-fault detector.

Since the set current value of the ground-fault detector is set larger than a calculated value of the leakage current, a ground-fault current can be detected by the ground-fault detector without malfunctioning due to the leakage current from the solar cell array.

In addition, though the set current value of the ground-fault interrupter is smaller than the set current value of the ground-fault detector, the ground-fault interrupter 1810 never interrupts the circuit by the leakage current of the solar cell array since the insulation transformer is used in the circuit.

Moreover, since the ground-fault detector 1810 is installed in the grounding line 1809 of the solar cell array, it is possible to easily detect the ground-fault current from the solar cell array 1801. In addition, since the solar cell array 1801 is connected to the system (power system) through the insulation transformer, the ground-fault current never flows into the system (power system), and hence, this structure exhibits an excellent effect of not having bad influence on the system.
(Effects of Negative Electrode Terminal Grounding)

As mentioned above in Example 2, with paying attention to a larger equivalent current that flows into a human body at the time of contacting with the positive electrode terminal or the negative electrode terminal at an arbitrary grounding position, the equivalent current at the time of grounding the line within a range from the negative electrode terminal to a neutral point becomes smaller than the equivalent current at the time of grounding the line within a range from the neutral point to the positive electrode terminal. Since all the lines of the solar cell array become positive electric potentials by grounding the negative electrode terminal, it is possible to improve safety.

According to the photovoltaic power generation system of the present invention, though the set current value of the ground-fault detector is set larger than the set current value of the ground-fault interrupter, it is possible to prevent the ground-fault interrupter from dropping even if a leakage current of the solar cell array exceeds the set current value of the ground-fault interrupter. Hence, it becomes possible to prevent a malfunction of the photovoltaic power generation system by the leakage current of the solar cell array.

What is claimed is:

1. A photovoltaic power generation system comprising:
    a solar cell array having a plurality of solar cells electrically connected to each other with a wiring member;
    a power conditioner for converting an output from the solar cell array into AC power;
    an insulation transformer provided between the solar cell array and a power system;
    a ground-fault interrupter provided between the power conditioner and the power system; and
    a ground-fault detector for detecting a ground-fault of the solar cell array,
    wherein a part of at least one of an electroactive portion of the plurality of solar cells and an electroactive portion of the wiring member is exposed to the outside, wherein a line of the solar cell array is grounded, wherein the ground-fault detector is provided at the grounded line, and wherein a set current value at which the ground-fault detector judges a ground-fault is larger than a set current value at which the ground-fault interrupter interrupts.

2. The system according to claim 1, wherein, when a leakage current Ir (A) flows in a current route from the at least one of the electroactive portions to the ground while the solar cell array operates in a moist state, the set current value of the ground-fault detector is larger than Ir, and the set current value of the ground-fault interrupter is smaller than Ir.

3. The system according to claim 1, wherein a positive electrode terminal of the solar cell array is grounded.

4. The system according to claim 1, wherein a negative electrode terminal of the solar cell array is grounded.

5. The system according to claim 1, wherein the line is grounded so that a ratio of an absolute value of a voltage between a positive electrode terminal of the solar cell array and the ground to an absolute value of a voltage between a negative electrode terminal of the solar cell array and the ground becomes approximately 2:1.

6. The system according to claim 1, wherein each of the solar cells comprises a photoelectric conversion layer, a collecting electrode arranged on side of a light-receiving surface of the photoelectric conversion layer, a surface wiring member and a coating member, and has an exposed portion, which is not coated with the coating member, in a part of the collecting electrode or the surface wiring member.

7. The system according to claim 6, wherein the coating member is composed of a resin and formed by coating.

8. The system according to claim 1, wherein a part of at least one of an electrode, arranged on a side of light-receiving surfaces of the plurality of sol cells, and the wiring member is not put in a solar cell envelope.

9. The system according to claim 1, wherein the sol cell array is installed on a supporting member.

10. The system according to claim 9, wherein the supporting member is a concrete stand.

* * * * *

UNITED STATES PATENT AND TRADEMARK OFFICE
CERTIFICATE OF CORRECTION

PATENT NO.     : 6,812,396 B2
DATED          : November 2, 2004
INVENTOR(S)    : Hidehisa Makita et al.

It is certified that error appears in the above-identified patent and that said Letters Patent is hereby corrected as shown below:

<u>Title page,</u>
Item [56], References Cited, FOREIGN PATENT DOCUMENTS,
"JP 2002-207662 7/2000" should read -- JP 2000-207662 7/2000 --.

<u>Column 1,</u>
Line 23, "groups I-II-" should read -- groups I-III- --;
Line 24, "I-VI2 compound" should read -- VI2 compound --; and
Line 54, "example, a" should read -- example, there is a --.

<u>Column 5,</u>
Line 19, "interrupter)" should read -- interrupter). --.

<u>Column 7,</u>
Line 66, "an" should read -- and --.

<u>Column 8,</u>
Lines 36 and 51, "respective" should read -- perspective --.

<u>Column 9,</u>
Line 8, "referring" should read -- references --.

<u>Column 10,</u>
Line 63, "solar," should read -- solar --.

<u>Column 11,</u>
Lines 37 and 39, "ethylene-tetrafluoroeyhylene" should read
-- ethylene-tetrafluoroethylene --.

<u>Column 12,</u>
Line 51, "support member on the ground" should read -- supporting member on the ground --.

<u>Column 13,</u>
Line 5, "support member on the ground" should read -- supporting member on the ground --.

<u>Column 15,</u>
Line 61, "does leak" should read -- does a leak --.

UNITED STATES PATENT AND TRADEMARK OFFICE
CERTIFICATE OF CORRECTION

PATENT NO.     : 6,812,396 B2
DATED          : November 2, 2004
INVENTOR(S)    : Hideshisa Makita et al.

It is certified that error appears in the above-identified patent and that said Letters Patent is hereby corrected as shown below:

<u>Column 16,</u>
Line 15, "an ground-fault" should read -- a ground-fault --.

<u>Column 24,</u>
Line 37, "on side" should read -- on a side --; and
Lines 47 and 49, "sol" should read -- solar --.

Signed and Sealed this

Twenty-ninth Day of November, 2005

JON W. DUDAS
*Director of the United States Patent and Trademark Office*